US012709667B2

(12) United States Patent
Farrell et al.

(10) Patent No.: US 12,709,667 B2
(45) Date of Patent: Aug. 18, 2026

(54) TRANSFERABLE MASKANTS SUITABLE FOR CHEMICAL PROCESSING

(71) Applicant: QUAKER CHEMICAL CORPORATION, Wilmington, DE (US)

(72) Inventors: Thomas P. Farrell, West Covina, CA (US); Bryan Vu, Temple City, CA (US); David Tomlinson, La Mirada, CA (US); Peter Weissman, Long Beach, CA (US)

(73) Assignee: QUAKER CHEMICAL CORPORATION, Wilmington, DE (US)

( * ) Notice: Subject to any disclaimer, the term of this patent is extended or adjusted under 35 U.S.C. 154(b) by 180 days.

(21) Appl. No.: 18/493,335

(22) Filed: Oct. 24, 2023

(65) Prior Publication Data

US 2024/0166829 A1 May 23, 2024

Related U.S. Application Data

(60) Provisional application No. 63/380,618, filed on Oct. 24, 2022.

(51) Int. Cl.
*C08J 5/18* (2006.01)
*B29C 48/08* (2019.01)
(Continued)

(52) U.S. Cl.
CPC ............... *C08J 5/18* (2013.01); *B32B 15/082* (2013.01); *B32B 15/20* (2013.01); *B32B 27/18* (2013.01);
(Continued)

(58) Field of Classification Search
None
See application file for complete search history.

(56) References Cited

U.S. PATENT DOCUMENTS

| | | |
|---|---|---|
| 2,326,699 A | 8/1943 | Swain et al. |
| 3,647,645 A | 3/1972 | Carrillo |

(Continued)

FOREIGN PATENT DOCUMENTS

| | | | |
|---|---|---|---|
| EP | 0428017 B1 * | 2/1994 | ........... A61L 15/585 |
| WO | WO-2018032879 A1 * | 2/2018 | ............. B32B 27/00 |
| WO | 2018042879 A1 | 8/2018 | |

OTHER PUBLICATIONS

Masson—Glass transitions and mixed phases in block SBS—J. Poly.Sci.B—2005 (Year: 2005).*

(Continued)

*Primary Examiner* — John Vincent Lawler
(74) *Attorney, Agent, or Firm* — Morgan, Lewis & Bockius LLP

(57) ABSTRACT

In one aspect, the present disclosure provides a polymer film with a low glass transition temperature. In one embodiment, when in contact with a metal substrate, the polymer film adheres to the metal substrate under heating and/or mechanical pressure. In one embodiment, the polymer film comprises a butadiene copolymer and a butylene polymer. In another aspect, the present disclosure further provides a method of masking a metal substrate using the polymer film. In yet another aspect, the present disclosure provides a method of chemically or electrochemically processing a metal substrate that is masked with the polymer film.

19 Claims, 11 Drawing Sheets

(51) Int. Cl.

| | |
|---|---|
| ***B29C 48/154*** | (2019.01) |
| ***B29K 19/00*** | (2006.01) |
| ***B29K 105/00*** | (2006.01) |
| ***B29K 705/02*** | (2006.01) |
| ***B32B 15/082*** | (2006.01) |
| ***B32B 15/20*** | (2006.01) |
| ***B32B 27/18*** | (2006.01) |
| ***B32B 27/30*** | (2006.01) |
| ***C23C 14/04*** | (2006.01) |
| ***C23C 14/24*** | (2006.01) |
| ***C23C 16/04*** | (2006.01) |
| ***C23C 18/16*** | (2006.01) |

(52) U.S. Cl.

CPC .......... *B32B 27/302* (2013.01); *C23C 14/042* (2013.01); *C23C 14/24* (2013.01); *C23C 16/042* (2013.01); *C23C 18/1605* (2013.01); *B29C 48/08* (2019.02); *B29C 48/154* (2019.02); *B29K 2019/00* (2013.01); *B29K 2105/0085* (2013.01); *B29K 2705/02* (2013.01); *B32B 2264/102* (2013.01); *B32B 2270/00* (2013.01); *B32B 2307/54* (2013.01); *C08J 2347/00* (2013.01); *C08J 2423/22* (2013.01)

(56) References Cited

U.S. PATENT DOCUMENTS

| | | | | | |
|---|---|---|---|---|---|
| 4,155,801 | A | 5/1979 | Provancher | | |
| 4,716,270 | A | 12/1987 | Gnanamuthu et al. | | |
| 4,778,697 | A | 10/1988 | Genske et al. | | |
| 6,433,069 | B1 * | 8/2002 | Oeltjen | C09J 153/02 | 524/505 |
| 6,703,043 | B1 * | 3/2004 | Himmelsbach | A61K 9/7076 | 424/443 |
| 9,434,129 | B2 | 9/2016 | Nguyen et al. | | |
| 10,669,419 | B2 | 6/2020 | Okamoto et al. | | |
| 2004/0204529 | A1 * | 10/2004 | Gipson | C09J 153/02 | 525/88 |
| 2011/0257337 | A1 * | 10/2011 | Oda | C09D 153/02 | 525/98 |
| 2012/0128966 | A1 * | 5/2012 | Ma | C09J 7/26 | 524/505 |
| 2014/0364532 | A1 | 12/2014 | Dubois et al. | | |
| 2015/0191636 | A1 * | 7/2015 | Otaka | C08G 18/755 | 252/511 |
| 2019/0172747 | A1 | 6/2019 | Quon et al. | | |

OTHER PUBLICATIONS

Sawazaki—WO 2018-042879 A1—PCT D1—MT—US 2023-077637—rubber-based PSA—2018 (Year: 2018).*

Gunduz—Polybutadiene composition on Tg of SBS block copolymers—PCT D2—US23-77637—2021 (Year: 2021).*

Paglicawan—properties-of-styrene-ethylene-butylene-styrene-block-copolymer-exfoliated-graphite—2021 (Year: 2021).*

Engineer Calculator—PIB Polymer Mechanic_Electric_Physical_Thermal_Properties—Nov. 21, 2025 (Year: 2025).*

Lamart—Understanding Pressure Sensitive Adhesives—Nov. 25, 2025 (Year: 2025).*

BASF—IRGANOX 1010 Info—Nov. 20, 2025 (Year: 2025).*

Mexpolimeros—SEPS—Properties—Nov. 26, 2025 (Year: 2025).*

International Search Report and Written Opinion mailed Jul. 11, 2024 in connection with PCT/US2024/025835, 9 pages.

3M Masking and Specialty Products, Design & Production Guide, "Masking, Duct and Flatback Tapes," Nov. 2016, pp. 6-12.

International Search Report and Written Opinion issued in PCT/US2023/077637, mailed Feb. 14, 2024, 9 pages.

Gunduz et al., "Effect of polybutadiene composition on the glass transition temperature of SBS block copolymers," J. of Sci. and Tech. A-Appl. Sci. and Eng., 22 (1), 2021, pp. 45-54.

"Polyisobutylene at a glance," Jan. 14, 2024, retrieved from https://pslc.ws/macrog/pibg.htm on Jan. 14, 2024.

Iskandar, el al. "The possibility of a high-temperature transition in a styrene-butadiene-styrene block copolymer as studied by DSC." Journal of Polymer Science: Polymer Physics Edition, 1981, vol. 19, pp. 1659-1661.

Kunal, et al. "Polyisobutylene: A most unusual polymer." Journal of Polymer Science Part B: Polymer Physics 46.13 (Jul. 1, 2008): 1390-1399.

Griffin, "Chemical Milling of Aluminum," 2018, pp. 280-331.

* cited by examiner

| Ingredients | Solution | Solid Film |
|---|---|---|
| perchloroethylene | 92.5% | 0 |
| polyisobutylene | 1% | 13.3% |
| styrene-butadiene copolymer | 6.5% | 86.7 |

FIG. 6

| | Before Etch | | | After Etch | | |
|---|---|---|---|---|---|---|
| Sample | Oz. | in | Oz./in | Oz. | in | Oz./in |
| 1 film | 7 | 1 | 7 | 7 | 15/32 | 15 |
| 2 film | 15 | 1 | 15 | 10 | 15/32 | 21 |

FIG. 7

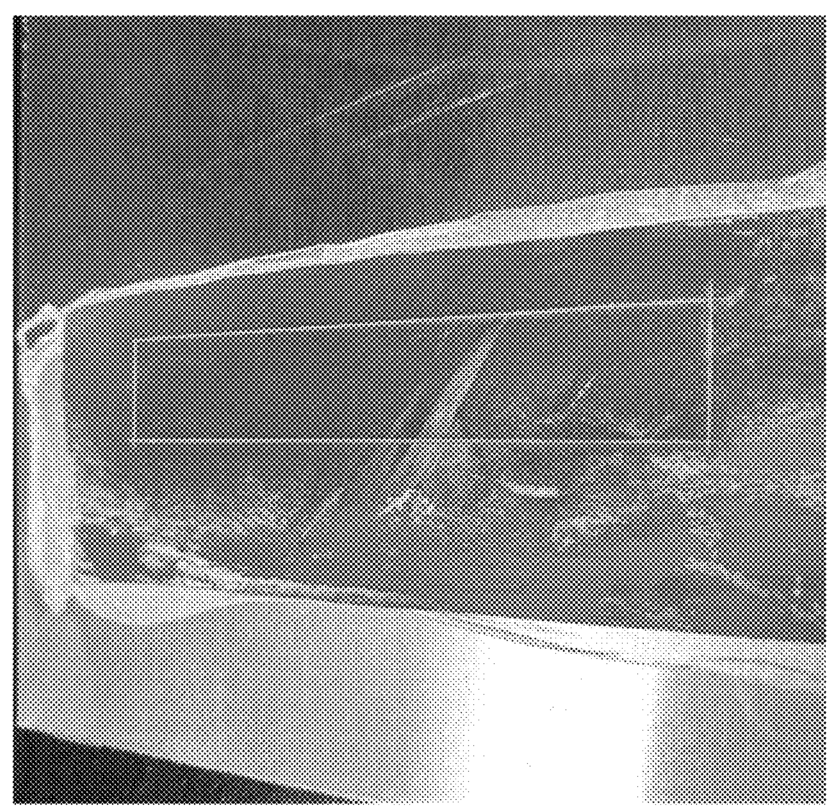
FIG. 9
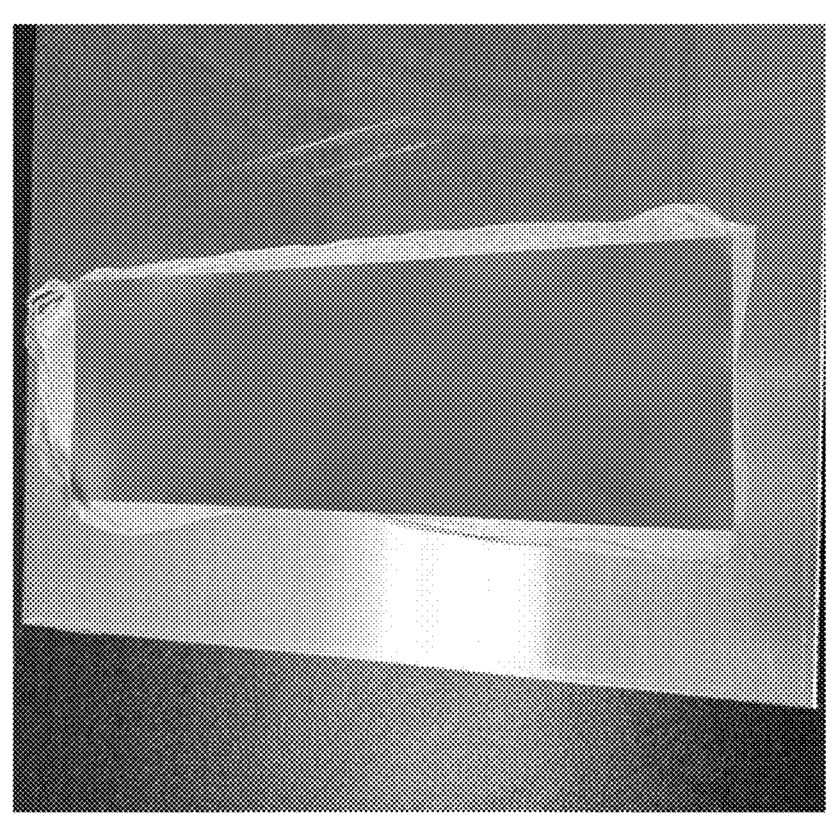

TRANSFERABLE MASKANTS SUITABLE FOR CHEMICAL PROCESSING

CROSS-REFERENCE TO RELATED APPLICATIONS

The present application is an U.S. nonprovisional application claiming priority to U.S. Provisional Application No. 63/380,618, filed Oct. 24, 2022, which is incorporated herein by reference in its entirety.

FIELD

The present disclosure relates to the field of manufacturing aerospace components, more specifically to the chemical milling of sheet metal. The present invention relates most specifically to the masking process used to pattern and protect the sheet metal substrate prior to chemical milling and further chemical processing. The present disclosure provides compositions and processes for masking substrates for chemical processing using temperature and/or pressure and, optionally, without a solvent carrier or polymerization reaction.

BACKGROUND

Aerospace parts need to be light and strong. Improved power-to-weight ratio for finished aircraft results in maneuverability, acceleration, and fuel efficiency. Over the years, high strength to weight materials such as aluminum, titanium, and various alloys have gained favor within the aerospace industry. Design of these parts is limited by the imagination of the design engineer and the production technology available to the process engineer. Chemical milling emerged as an enabling technology (Harris, W. T., "Chemical Milling, The Technology of Cutting Materials by Etching," Oxford University Press, 1976) during the 1950s for production of missile casings and experimental aircraft parts. Evolution of the design of aircraft and spacecraft necessitated application of these weight saving designs to large parts with curvature and complex tapers which were sometimes impossible to process using traditional machining methods. Current commercial aircraft construction makes substantial use of chemical milling to produce fuselage, leading edge, bulkhead, and various other components.

The typical process for chemical milling and chemical processing of aerospace components consists of cleaning the sheet metal, applying a suitable maskant to the sheet metal, forming the sheet metal into a masked part, scribing the masked part, line sealing the masked part, removing select pieces of the maskant while the majority of the maskant remain intact with the part, chemical milling the masked part, cleaning the chemical milled metal surface of the masked part, and further surface treatment steps depending on the final use of the part. Depending on the final use of the part, after further surface treatment, the part can be drilled and/or routed before being "de-masked." The present disclosure specifically relates to applying the maskant to sheet metal prior to forming or scribing.

Alloys used in the manufacture of aerospace components are selected not only for their strength to weight ratios, but also for their resistance to corrosion. This feature necessitates aggressive chemical milling solutions in order to dissolve away material. The compositions of these chemical milling solutions are known within the industry. The aggressive nature of these chemical milling solutions requires a maskant to be chemically resistant to degradation during this process. A number of suitable maskant compositions are commercially available, typically consisting of a chemically resistant polymer blend dissolved in an organic solvent of appropriate polarity. The compositions of these maskants are typically industry secrets but can be approximated by the composition presented in prior art (U.S. Pat. No. 4,155,801). As organic solvents wane in popularity due to health and environmental concerns, several alternative technologies have presented themselves, each with their own drawbacks, such as two component (100% solids) maskants, water-based maskants (low or zero VOC), and radiation-curable maskants (100% solids, near zero VOC).

Maskant films are generally applied to a workpiece by the following methods: spray application, flow-coating, dip-coating, or brush. Each method has both benefits and downsides in regard to the application efficiency, the uniformity of the applied coating, the presence of defects, and the equipment expenditure required for the process. The alternative maskant technologies such as two-component, water-based, and radiation curable maskants all have application process limitations which prevent widespread adoption as a replacement to solvent based maskants. Briefly, two-component maskants can only be applied via specialized airless spray equipment and suffer from uneven film builds. Water based maskants require long dry times due to the low volatility of water. Radiation-curable maskants require a separate curing stage with the use of high intensity and hazardous ultraviolet light.

There is a need in the art for a masking technology that is 100% solids, zero VOC, and that completely removes solvent from the masking process. The present disclosure solves this unmet need.

BRIEF DESCRIPTION OF THE DRAWINGS

FIG. 6 is a table detailing the composition of the solution used to produce a re-adherence layer freestanding film which is then used to form multilayer sandwich structures atop a workpiece.

FIG. 7 is a table reporting the resulting adhesion of single layer and two-layer maskant applied to a workpiece using the method of this disclosure and the change associated with chemical processing.

FIG. 9 contains two photographs showing the placement of a freestanding maskant film atop the re-adherence layer forming a sandwich (multilayer films) atop a worksheet prior to (left) and after (right) application of elevated temperature and pressure. The photograph on the right also shows knife-scribe lines for testing of chemical milling line definition and adhesion.

FIG. 13A shows a maskant film that was transferred and adhered to an aluminum substrate using temperature and pressure. The aluminum surface was wiped with solvent and then cleaned in an aqueous alkaline bath. The application of temperature and pressure was performed with a Carver Press at a temperature of 150° C. and a pressure of 580 psi.

FIG. 13B shows a maskant film that was transferred and adhered to an aluminum substrate using temperature and pressure and then chemically milled in type 2 caustic etchant. Markings on the film display dimensions for appropriate pressure calibration as well as adhesion values from initial, 15 minutes chemical milling, 30 minutes chemical milling, and next day. The adhesion is reported in oz/in.

SUMMARY OF THE DISCLOSURE

Figures 1, 2:
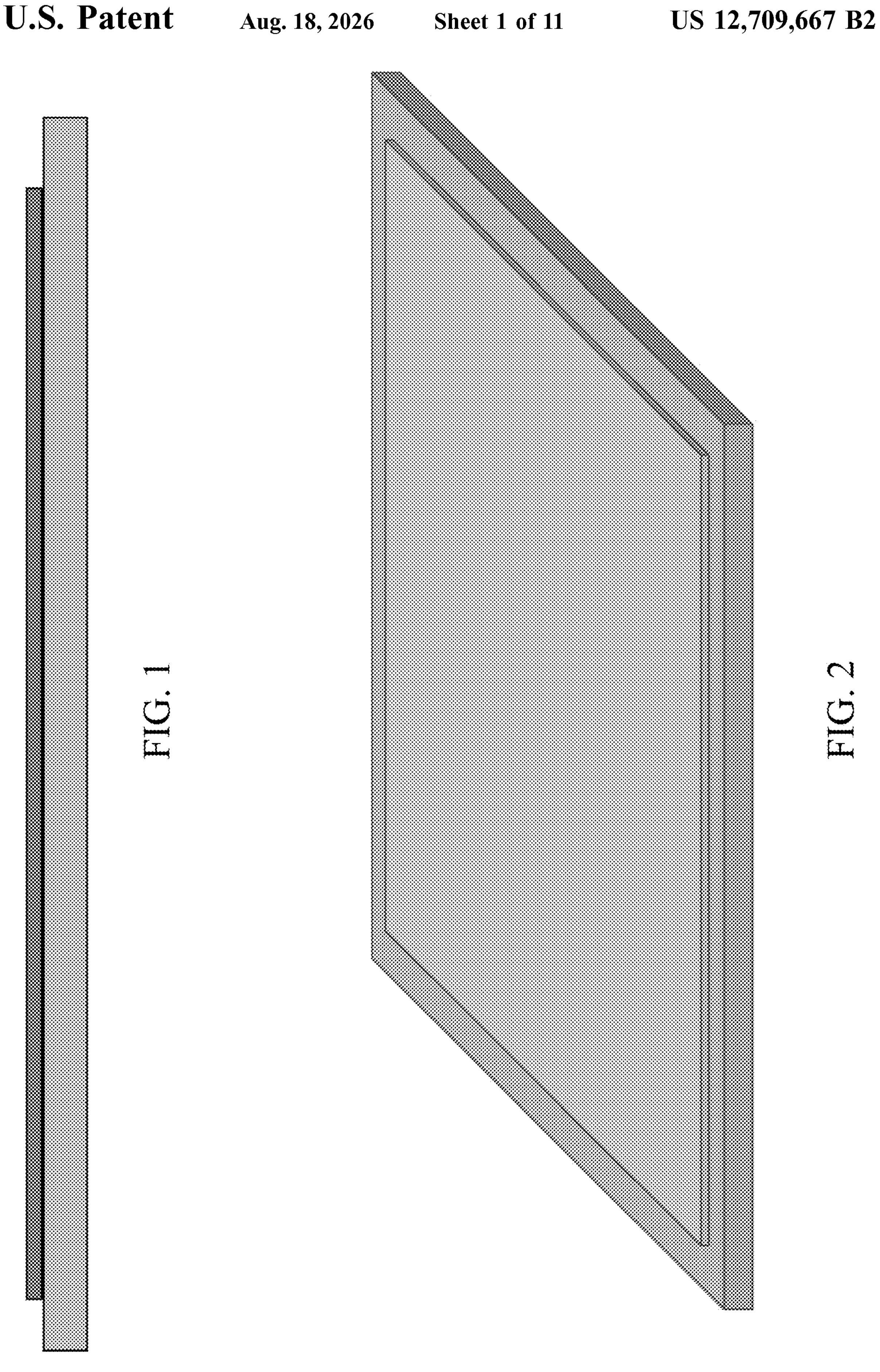
FIG. 1 is a cross-sectional, elevational view of a freestanding film placed atop a worksheet by the method of this disclosure. (Apparatus for application of temperature and pressure is omitted for clarity)
FIG. 2 is a perspective view of a freestanding film placed atop a worksheet by the method of this disclosure. (Apparatus for application of temperature and pressure is omitted for clarity)

In one aspect, the present disclosure provides a polymer film comprising a butadiene copolymer having a glass transition temperature of about −150° ° C. to about 150° ° C. and a butylene polymer having a glass transition temperature of about −90° ° C. to −40° C., wherein the butadiene copolymer and butylene polymer are oriented such that the polymer film has a first microstructure. In one embodiment, upon contacting the polymer film with a metal substrate under elevated temperature and/or mechanical pressure, the polymer film adopts a second microstructure. In one embodiment, the second microstructure has increased adhesion to the metal substrate. In one embodiment, the film is chemically resistant to acids and bases. In one embodiment, the butadiene copolymer is selected from styrene-butadiene-styrene (SBS), styrene-ethylene-butylene-styrene (SEBS), styrene-ethylene-propylene-styrene (SEPS), and combinations thereof. In one embodiment, the butadiene copolymer is styrene-butadiene-styrene (SBS) or a blend of styrene-ethylene-butylene-styrene (SEBS) and styrene-ethylene-propylene-styrene (SEPS). In one embodiment, the blend of SEBS and SEPS has a w/w ratio of about 7:1 to about 10:1. In one embodiment, SBS has a first glass transition temperature of about −115° C. to about −100° C. and a second glass transition temperature of about 95° C. to about 105° C. and the blend of SEBS and SEPS has a first glass transition temperature of about −50° C. to about −20° C. and a second glass transition temperature of about 90° C. to about 115° C. In one embodiment, the butylene polymer is polyisobutylene. In one embodiment, the polymer film comprises about 75% to about 95% by weight of the butadiene copolymer and about 5.0% to about 25.0% by weight of the butylene polymer. In one embodiment, the polymer film further comprises an aromatic hydrocarbon resin, an inorganic filler, an antioxidant, or a combination thereof. In one embodiment, the aromatic hydrocarbon resin is a C9 resin, the filler is an inorganic mineral oxide or an inorganic carbon, and/or the antioxidant is a hindered phenolic compound or dilauryl thiodipropionate. In one embodiment, the C9 resin has a softening point between about 100° C. and about 160° C. and/or the filler is selected from a silicate, talc, a feldspar, a chlorate, alumina, titania, carbon black, nanostructured carbon, and combinations thereof. In one embodiment, the polymer film comprises about 30% by weight to about 50% by weight of the butadiene polymer, about 0.5% by weight to about 15% by weight of the butylene polymer, and about 40% by weight to about 70% by weight of the combination of the aromatic hydrocarbon resin, the inorganic filler, and/or the antioxidant. In one embodiment, the polymer film is free-standing. In one embodiment, the polymer film is substantially solvent-free. In one embodiment, the tensile strength of the polymer film is about 650 psi to about 750 psi. In one embodiment, the metal substrate is sheet metal. In one embodiment, the polymer film having the second microstructure has a peel adhesion to the metal substrate of about 2 oz/in to about 35 oz/in. In one embodiment, the metal substrate is an aluminum substrate. In one embodiment, the metal substrate is polished clad aluminum.

In another aspect, the present disclosure provides a method of making a polymer film, the method comprising: (i) loading a solution comprising a butadiene copolymer having a glass transition temperature of about −150° C. to about 150° C. and a butylene polymer having a glass transition temperature of about −90° C. to −40° C. into compounding machinery; and (ii) extruding the solution from the compounding machinery to form a first polymer film described in the above embodiments. In one embodiment, extruding comprises extruding the solution from the compounding machinery onto a metal substrate to form the first polymer film directly on the metal substrate or wherein extruding comprises extruding the solution from the compounding machinery to form a free-standing first polymer film. In one embodiment, the method further comprises: (iii) loading a solution comprising a butadiene copolymer having a glass transition temperature of about −150° ° C. to about 150° C. and a butylene polymer having a glass transition temperature of about −90° C. to −40° C. into compounding machinery; and (iv) extruding the solution from the compounding machinery to form a second polymer film described in the above embodiments. In one embodiment, extruding of (iv) comprises extruding the solution from the compounding machinery onto the first polymer film to form the second polymer film directly on top of the first polymer film, resulting in a multi-layer polymer film; or extruding of (iv) comprises extruding the solution from the compounding machinery to form a free-standing second polymer film which is placed directly on top of the free-standing first polymer film, resulting in a multi-layer polymer film. In one embodiment, the solution comprises about 80% by weight to about 98% by weight solvent, about 1% by weight to about 15% by weight of the butadiene copolymer, and about 0.01% by weight to about 10% by weight of the butylene polymer. In one embodiment, the solution further comprises an aromatic hydrocarbon resin, an inorganic filler, an antioxidant, or a combination thereof. In one embodiment, the solution comprises about 65% by weight to about 85% by weight solvent, about 5% by weight to about 15% by weight of the butadiene polymer, about 0.01% by weight to about 5% by weight of the butylene polymer, and about 5% by weight to about 25% by weight of the combination of the aromatic hydrocarbon resin, the inorganic filler, and/or the antioxidant.

In yet another aspect, the present disclosure provides a method of making a polymer film, the method comprising: (i) depositing a solution comprising a butadiene copolymer having a glass transition temperature of about −150° C. to about 150° C. and a butylene polymer having a glass transition temperature of about −90° C. to −40° C. onto a support; and (ii) evaporating the solvent to form a first polymer film described in the above embodiments. In one embodiment, the method further comprises: (iii) depositing a solution comprising a butadiene copolymer having a glass transition temperature of about −150° ° C. to about 150° C. and a butylene polymer having a glass transition temperature of about −90° C. to −40° C. directly on top of the first polymer film; and (iv) evaporating the solvent to form a second polymer film described in the above embodiments on top of the first polymer film. In one embodiment, the support comprises a metal substrate. In one embodiment, the solution comprises about 80% by weight to about 98% by weight solvent, about 1% by weight to about 15% by weight of the butadiene copolymer, and about 0.01% by weight to about 10% by weight of the butylene polymer. In one embodiment, the solution further comprises an aromatic hydrocarbon resin, an inorganic filler, an antioxidant, or a combination thereof. In one embodiment, the solution comprises about 65% by weight to about 85% by weight solvent, about 5% by weight to about 15% by weight of the butadiene polymer, about 0.01% by weight to about 5% by weight of the butylene polymer, and about 5% by weight to about 25% by weight of the combination of the aromatic hydrocarbon resin, the inorganic filler, and/or the antioxidant.

In yet another aspect, the present disclosure provides a method of making a polymer film, the method comprising: (i) loading a solvent-free composition comprising a butadiene copolymer having a glass transition temperature of about −150° C. to about 150° C. and a butylene polymer having a glass transition temperature of about −90° C. to −40° C. into compounding machinery; and (ii) extruding the composition from the compounding machinery to form a first polymer film described in the above embodiments. In one embodiment, extruding comprises extruding the composition from the compounding machinery onto a metal substrate to form the first polymer film directly on the metal substrate or extruding comprises extruding the composition from the compounding machinery to form a free-standing first polymer film. In one embodiment, the method further comprises: (iii) loading a solvent-free composition comprising a butadiene copolymer having a glass transition temperature of about −150° C. to about 150° C. and a butylene polymer having a glass transition temperature of about −90° C. to −40° C. into compounding machinery; and (iv) extruding the composition from the compounding machinery to form a second polymer film described in the above embodiments. In one embodiment, extruding of (iv) comprises extruding the composition from the compounding machinery onto the first polymer film to form the second polymer film directly on top of the first polymer film, resulting in a multi-layer polymer film; or extruding of (iv) comprises extruding the composition from the compounding machinery to form a free-standing second polymer film which is placed directly on top of the free-standing first polymer film, resulting in a multi-layer polymer film. In one embodiment, the solvent-free composition further comprises an aromatic hydrocarbon resin, an inorganic filler, an antioxidant, or a combination thereof. In one embodiment, the solvent-free composition comprises about 30% by weight to about 50% by weight of the butadiene polymer, about 0.5% by weight to about 15% by weight of the butylene polymer, and about 40% by weight to about 70% by weight of the combination of the aromatic hydrocarbon resin, the inorganic filler, and/or the antioxidant. In one embodiment, the aromatic hydrocarbon resin is a C9 resin and/or the filler is an inorganic mineral oxide or an inorganic carbon.

In yet another aspect, the present disclosure provides a method of masking a metal substrate, the method comprising: covering a top surface of the metal substrate with a first polymer film described in the above embodiments such that the first polymer film is in contact with the top surface of the metal substrate; and heating and/or applying mechanical pressure to the first polymer film, resulting in adhesion of the first polymer film to the top surface of the metal substrate. In one embodiment, the step of covering the top surface of the metal substrate with the first polymer film comprises extruding the first polymer film directly from compounding machinery onto the top surface of the metal substrate or extruding the first polymer film from compounding machinery and placing the first polymer film onto the top surface of the metal substrate. In one embodiment, extruding the first polymer film from the compounding machinery comprises: loading a solution comprising a butadiene copolymer having a glass transition temperature of about −150° C. to about 150° C. and a butylene polymer having a glass transition temperature of about −90° C. to −40° ° C. into the compounding machinery; and extruding the solution from the compounding machinery to form the first polymer film; or loading a solvent-free composition comprising a butadiene copolymer having a glass transition temperature of about −150° C. to about 150° C. and a butylene polymer having a glass transition temperature of about −90° C. to −40° ° C. into the compounding machinery; and extruding the composition from the compounding machinery to form the first polymer film. In one embodiment, the step of covering the top surface of the metal substrate with the first polymer film comprises depositing a solution comprising a butadiene copolymer having a glass transition temperature of about −150° C. to about 150° C. and a butylene polymer having a glass transition temperature of about −90° ° C. to −40° C. onto the top surface of the metal substrate and evaporating the solvent, forming the first polymer film. In one embodiment, the first polymer film comprises two polymer films wherein one film is extruded or deposited directly on top of the other film or wherein one film is placed directly on top of the other film. In one embodiment, the method further comprises: covering a bottom surface of the metal substrate with a second polymer film comprising a butadiene copolymer having a glass transition temperature of about −150° C. to about 150° C. and a butylene polymer having a glass transition temperature of about −90° C. to −40° C. such that the second polymer film is in contact with the bottom surface of the metal substrate; and heating and/or applying mechanical pressure to the second polymer film, resulting in adhesion of the second polymer film to the bottom surface of the metal substrate. In one embodiment, the step of covering the bottom surface of the metal substrate with the second polymer film comprises extruding the second polymer film directly from compounding machinery onto the bottom surface of the metal substrate or extruding the second polymer film from compounding machinery and placing the second polymer film onto the bottom surface of the metal substrate. In one embodiment, extruding the second polymer film from the compounding machinery comprises: loading a solution comprising a butadiene copolymer having a glass transition temperature of about −150° C. to about 150° C. and a butylene polymer having a glass transition temperature of about −90° C. to −40° C. into the compounding machinery; and extruding the solution from the compounding machinery to form the second polymer film; or loading a solvent-free composition comprising a butadiene copolymer having a glass transition temperature of about −150° ° C. to about 150° C. and a butylene polymer having a glass transition temperature of about −90° C. to −40° C. into the compounding machinery; and extruding the composition from the compounding machinery to form the second polymer film. In one embodiment, the step of covering the bottom surface of the metal substrate with the second polymer film comprises depositing a solution comprising a butadiene copolymer having a glass transition temperature of about −150° C. to about 150° C. and a butylene polymer having a glass transition temperature of about −90° C. to −40° C. onto the bottom surface of the metal substrate and evaporating the solvent, forming the second polymer film. In one embodiment, the second polymer film comprises two polymer films wherein one film is extruded or deposited directly on top of the other film or wherein one film is placed directly on top of the other film. In one embodiment, the method is preceded by the step of cleaning and/or chemically treating a top surface and a bottom surface of the metal substrate.

In yet another aspect, the present disclosure provides a method of chemically processing a metal substrate, comprising: chemical milling, electroless plating, chemical surface treatment, chemical vapor deposition, or evaporative coating a metal substrate masked with the polymer film described in the above embodiments; chemical milling, electroless plating, chemical surface treatment, chemical vapor deposition, or evaporative coating a metal substrate masked with a polymer film made by a method described above; or chemical milling, electroless plating, chemical surface treatment, chemical vapor deposition, or evaporative coating a masked metal substrate made by a method described above.

In yet another aspect, the present disclosure provides a method of electrochemically processing a metal substrate, comprising: anodizing, electrochemical polishing, plating, electrostatic coating, or electrofinishing a metal substrate masked with the polymer film described in the above embodiments; anodizing, electrochemical polishing, plating, electrostatic coating, or electrofinishing a metal substrate masked with a polymer film made by a method described above; or anodizing, electrochemical polishing, plating, electrostatic coating, or electrofinishing a masked metal substrate made by a method described above.

In yet another aspect, the present disclosure provides a metal substrate comprising an adhered maskant, wherein: the maskant comprises the polymer film described in the above embodiments; or the maskant comprises the polymer film made by a method described above.

In yet another aspect, the present disclosure provides a masked metal substrate made by a method described above.

DETAILED DESCRIPTION OF THE DISCLOSURE

While embodiments encompassing the general inventive concepts may take diverse forms, various embodiments will be described herein, with the understanding that the present disclosure is to be considered merely exemplary, and the general inventive concepts are not intended to be limited to the disclosed embodiments.

Unless otherwise noted, terms are to be understood according to conventional usage by those of ordinary skill in the relevant art.

The abbreviations used herein have their conventional meaning within the chemical and biological arts. The chemical structures and formulae set forth herein are constructed according to the standard rules of chemical valency known in the chemical arts.

The term "about" used in the context of a numeric value indicates a range of +/−10% of the numeric value, unless expressly indicated otherwise.

Embodiments of the disclosure set forth herein include polymer films with low glass transition temperatures such that the polymer films can adhere to a metal substrate upon applying heat and mechanical pressure. Other embodiments include methods of using the disclosed polymer films as maskants for metal substrates. Still other embodiments of the disclosure include solutions for making the polymer films. Additional embodiments of the disclosure are also discussed herein.

Polymer Film

In one aspect, the present disclosure provides a polymer film comprising a butadiene copolymer having a glass transition temperature of about −150° C. to about 150° C. and a butylene polymer having a glass transition temperature of about −90° C. to −40° C., wherein the butadiene copolymer and butylene polymer are oriented such that the polymer film has a first microstructure. In one embodiment, the microstructure of the polymer film is determined by the method used to form the film. In one embodiment, the low glass transition temperature of the butadiene polymer and the butylene polymer leads to a polymer film that has high mobility at elevated temperatures. In one embodiment, the polymer film does not comprise solvent. In one embodiment, the polymer film is substantially or completely free of volatile organic compounds (VOCs).

In one embodiment, the butadiene copolymer is selected from styrene-butadiene-styrene (SBS), styrene-ethylene-butylene-styrene (SEBS), styrene-ethylene-propylene-styrene (SEPS), and combinations thereof.

In one embodiment, the butadiene copolymer is SBS. In one embodiment, the SBS has a first glass transition temperature of about −115° C. to about −100° C. and a second glass transition temperature of about 95° C. to about 105° C. In one embodiment, the SBS has a first glass transition temperature of about −107° C. and a second glass transition temperature of about 100 ° C.

In another embodiment, the butadiene copolymer is a blend of SEBS and SEPS. In one embodiment, the w/w ratio of SEBS to SEPS is about 20:1, 18:1, 16:1, 14:1, 12:1, 10:1, 9:1, 8:1, 6:1, 2:1, 1:1, 1:2, 1:4, 1:6, 1:8, 1:9, 1:10, 1:12, 1:14, 1:16, 1:18, or 20:1. In one embodiment, the w/w ratio of SEBS to SEPS is about 11:1, 10:1, 9:1, 8:1 or 7:1. In one embodiment, the w/w ratio of SEBS to SEPS is about 9:1. In one embodiment, the glass transition temperature of the blend of SEBS and SEPS blend is about −50° C. to about 107° C. In one embodiment, the blend of SEBS and SEPS has a first glass transition temperature of about −50° C. to about −20° C. and a second glass transition temperature of about 80° C. to about 120° C. or about 95° C. to about 107° C. In one embodiment, the first glass transition temperature is for the butadiene/propylene blocks of the copolymer and the second glass transition temperature is for the ethylene/styrene blocks of the copolymer. In one embodiment, the blend of SEBS and SEPS is a "high melt-flow" material. In one embodiment, a high melt-flow material is a material that behaves similarly to a fluid under increased temperature and/or pressure.

In one embodiment, the butylene polymer is polyisobutylene. In one embodiment, the polyisobutylene has a glass transition temperature of about −78° C. to about −60° C. In one embodiment, the polyisobutylene is BASF Oppanol polyisobutylene (PIB). In one embodiment, the polyisobutylene is medium molecular weight BASF Oppanol PIB. In one embodiment, the polymer film comprises about 75% to about 95% by weight of the butadiene copolymer and about 5.0% to about 25.0% by weight of the butylene polymer. In one embodiment, the polymer film comprises about 87% by weight of the butadiene copolymer and about 13% by weight of the butylene polymer. In one embodiment, the polymer film comprising the butadiene copolymer and the butylene polymer is a high melt-flow material.

In one embodiment, the polymer film is chemically resistant to acids and bases.

In one embodiment, the tensile strength of the polymer film is about 650 psi to about 750 psi.

In one embodiment, the polymer film is a free-standing polymer film. In one embodiment, the free-standing polymer film can be stored and/or handled unsupported. In one embodiment, a polymer film formed on a substrate is still referred to as a free-standing polymer film because, if removed from the substrate, the film can be stored and/or handled unsupported. In another embodiment, the polymer film comprises a release sheet on the top and/or bottom of the polymer film. In one embodiment, the release sheet is used for ease of storing, rolling, and/or handling the polymer film.

In one embodiment, the polymer film further comprises an aromatic hydrocarbon resin, an inorganic filler, an antioxidant, or a combination thereof. In one embodiment, the aromatic hydrocarbon resin is a C9 resin. In one embodiment, the hydrocarbon resin has a softening point between about 70° C. and about 200° ° C., about 85° C. and about 180° C., or about 100° C. and about 160° C. In one embodiment, the hydrocarbon resin is a C9 resin with a softening point of between about 70° C. and about 200° ° C., about 85° C. and about 180° C., or about 100° C. and about 160° ° C. In one embodiment, the inorganic filler comprises an inorganic mineral oxide. In one embodiment, the inorganic mineral oxide comprises silicates, talc, feldspars, chlorates, alumina, and/or titania. In another embodiment, the inorganic filler comprises inorganic carbon. In one embodiment, the inorganic carbon comprises carbon black and/or nanostructured carbon. In one embodiment, the antioxidant comprises a hindered phenolic antioxidant or dilauryl thiodipropionate.

In one embodiment, a solvent is applied to one side of the polymer film as a tackifier which aids in adhering the polymer film to the metal substrate. In one embodiment, the solvent comprises an organic solvent.

In one embodiment, upon contacting the polymer film with a metal substrate under elevated temperature and/or mechanical pressure, the polymer film adapts a second microstructure. In one embodiment, the second microstructure has increased adhesion to the metal substrate. In one embodiment, the metal substrate is sheet metal. In one embodiment, the polymer film having the second microstructure has a peel adhesion to the metal substrate of about 2 oz/in to about 35 oz/in, about 10 oz/in to about 25 oz/in, about 2 oz/in to about 25 oz/in, about 5 oz/in to about 25 oz/in, or about 10 oz/in to about 20 oz/in. In one embodiment, the peel adhesion of the polymer film having the second microstructure changes with chemical processing. In one embodiment, the polymer film having the second microstructure has a peel adhesion of about 2 oz/in to about 12 oz/in before chemical processing. In one embodiment, the polymer film having the second microstructure has a peel adhesion of about 7 oz/in before chemical processing. In one embodiment, the polymer film having the second microstructure has a peel adhesion of about 10 oz/in to about 20 oz/in after chemical processing. In one embodiment, the polymer film having the second microstructure has a peel adhesion of about 15 oz/in after chemical processing. In another embodiment, the peel adhesion of the polymer film having the second microstructure does not significantly change with chemical processing. In one embodiment, the polymer film having the second microstructure has a peel adhesion of about 2 oz/in to about 25 oz/in before chemical processing and retains a peel adhesion of about 2 oz/in to about 25 oz/in after chemical processing. In one embodiment, the polymer film having the second microstructure has a peel adhesion of about 10 oz/in to about 15 oz/in before chemical processing and retains a peel adhesion of about 10 oz/in to about 15 oz/in after chemical processing. In one embodiment, the polymer film comprises a blend of SEBS with SEPS and a butylene polymer wherein the polymer film having a second microstructure has a peel adhesion of about 10 oz/in to about 15 oz/in before chemical processing and retains a peel adhesion of about 10 oz/in to about 15 oz/in after chemical processing. In embodiment, the peel adhesion is measured on a polished clad aluminum substrate.

In one embodiment, the metal substrate is an aluminum substrate. In one embodiment, the metal substrate is polished clad aluminum. In one embodiment, the metal substrate is an aerospace component. In one embodiment, the polymer film functions as a maskant to protect the metal substrate during forming and/or scribing. Therefore, in one embodiment, the maskant is applied to the metal substrate before forming and/or scribing. In one embodiment, the polymer film functions as a maskant to protect the metal substrate during forming and/or scribing, chemical processing, and optional further treatment steps. In one embodiment, the optional further treatment steps comprise drilling and/or routing. In one embodiment, the maskant protects an aerospace component during the forming, scribing, chemical processing, and optional further treatment steps necessary to fabricate aerospace components. In one embodiment, the metal substrate is demasked following the forming, scribing, chemical processing, and optional further treatment steps.

Solution to Form a Polymer Film

In another aspect, the present disclosure provides a solution from which the polymer film described elsewhere herein is made.

In one embodiment, the solution comprises an organic solvent. In one embodiment, the solvent comprises a halogenated organic solvent. In one embodiment, the halogenated organic solvent comprises a halogenated alkene. In one embodiment, the halogenated organic solvent comprises a chlorinated alkene. In one embodiment, the halogenated organic solvent comprises perchloroethylene. In another embodiment, the organic solvent comprises an aromatic solvent. In one embodiment, the aromatic solvent comprises toluene, xylene, cumene, and/or pseudocumene. In one embodiment, the aromatic solvent comprises toluene or xylene. In another embodiment, the aromatic solvent comprises solvent naphtha. In one embodiment, the aromatic solvent comprises Aromatic 100. In another embodiment, the aromatic solvent comprises a halogenated aromatic solvent. In one embodiment, the halogenated aromatic solvent comprises parachlorobenzotrifluoride. In one embodiment, the solution comprises about 50% by weight to about 90% by weight, about 55% by weight to about 85% by weight, about 60% by weight to about 80% by weight, about 65% by weight to about 80% by weight, or about 70% by weight to about 80% by weight solvent. In one embodiment, the solution comprises about 76% by weight solvent. In another embodiment, the solution comprises about 75% by weight to about 98% by weight, about 80% by weight to about 98% by weight, about 85% by weight to about 98% by weight, about 90% by weight to about 98% by weight, or about 90% by weight to about 95% by weight solvent. In one embodiment, the solution comprises about 92.5% by weight solvent.

In one embodiment, the solution comprises a butadiene copolymer described elsewhere herein. In one embodiment, the butadiene copolymer is SBS. In one embodiment, the butadiene copolymer is a blend of SEBS and SEPS. In one embodiment, solution comprises about 1% by weight to about 25% by weight, about 1% by weight to about 20% by weight, about 1% by weight to about 15% by weight, about 4% by weight to about 15% by weight, about 6% by weight to about 12% by weight, about 1% by weight to about 10% by weight, or about 4% by weight to about 8% by weight of the butadiene copolymer. In one embodiment, the solution comprises about 6.5% by weight of the butadiene copolymer. In another embodiment, the solution comprises about 9% by weight or about 9.5% by weight of the butadiene copolymer.

In one embodiment, the solution comprises a butylene polymer described elsewhere herein. In one embodiment, the butylene polymer is polyisobutylene. In one embodiment, the solution comprises about 0.001% by weight to about 18% by weight, about 0.001% by weight to about 16% by weight, about 0.001% by weight to about 14% by weight, about 0.001% by weight to about 12% by weight, about 0.001% by weight to about 10% by weight, about 0.001% by weight to about 8% by weight, about 0.001% by weight to about 6% by weight, about 0.001% by weight to about 4% by weight, about 0.001% by weight to about 2% by weight, about 0.01% by weight to about 2% by weight, or about 0.1% by weight to about 2% by weight polyisobutylene. In one embodiment, the solution comprises about 1% by weight polyisobutylene.

In one embodiment, the solution comprises an aromatic hydrocarbon resin, an inorganic filler, and/or an antioxidant described elsewhere herein. In one embodiment, the solution comprises about 0.1% by weight to about 90% by weight, about 0.1% by weight to about 80% by weight, about 0.1% by weight to about 70% by weight, about 0.1% by weight to about 60% by weight, about 0.1% by weight to about 50% by weight, about 0.1% by weight to about 40% by weight, about 0.1% by weight to about 30% by weight, about 0.1% by weight to about 20% by weight, about 1% by weight to about 20% by weight, or about 5% by weight to about 15% by weight of the combination of the aromatic hydrocarbon resin, the inorganic filler, and/or the antioxidant.

In one embodiment, the solution described above is loaded into compounding machinery and is extruded/calendared to form the polymer film described elsewhere herein. In one embodiment, after extrusion/calendaring from the compounding machinery, the polymer film is substantially free or completely free of solvent. In one embodiment, "substantially free of solvent" as used herein means a polymer film (maskant) comprising less than 5%, less than 4%, less than 3%, less than 2%, less than 1%, or less than 0.5% solvent.

In one embodiment, the polymer film formed from the solution described above is a free-standing polymer film.

In one embodiment, the solution described above is deposited onto a metal substrate and the solvent is allowed to evaporate, forming a polymer film. In one embodiment, after solution deposition and solvent evaporation, the polymer film is substantially free or completely free of solvent.

Solvent-Free Composition to Form the Polymer Film

In yet another aspect, the present disclosure provides a solvent-free composition from which the polymer film described elsewhere herein is made. In one embodiment, the polymer film is a free-standing polymer film. In one embodiment, the polymer film is produced via plastic compounding.

In one embodiment, the solvent-free composition comprises a butadiene copolymer described elsewhere herein. In one embodiment, the butadiene copolymer is SBS. In one embodiment, the butadiene copolymer is a blend of SEBS and SEPS. In one embodiment, the composition comprises about 5% by weight to about 90% by weight, about 10% by weight to about 85% by weight, about 15% by weight to about 80% by weight, about 20% by weight to about 75% by weight, about 25% by weight to about 70% by weight, about 30% by weight to about 65% by weight, about 35% by weight to about 60% by weight, about 35% by weight to about 50% by weight, or about 35% by weight to about 45% by weight of the butadiene copolymer. In one embodiment, the composition comprises about 41% by weight of the butadiene copolymer.

In one embodiment, the solvent-free composition comprises a butylene polymer described elsewhere herein. In one embodiment, the butylene polymer is polyisobutylene. In one embodiment, the composition comprises about 0.001% by weight to about 18% by weight, about 0.001% by weight to about 16% by weight, about 0.001% by weight to about 14% by weight, about 0.01% by weight to about 14% by weight, about 0.01% by weight to about 12% by weight, about 0.1% by weight to about 12% by weight, about 0.1% by weight to about 10% by weight, about 0.1% by weight to about 8% by weight, about 1% by weight to about 8% by weight, about 1% by weight to about 6% by weight, or about 2% by weight to about 6% by weight polyisobutylene. In one embodiment, the composition comprises about 4% by weight polyisobutylene.

In one embodiment, the solvent-free composition comprises an aromatic hydrocarbon resin, an inorganic filler, and/or an antioxidant described elsewhere herein. In one embodiment, the composition comprises between about 1% by weight to about 90% by weight, about 5% by weight to about 85% by weight, about 10% by weight to about 80% by weight, about 15% by weight to about 75% by weight, about 20% by weight to about 70% by weight, about 25% by weight to about 65% by weight, about 35% by weight to about 65% by weight, about 45% by weight to about 65% by weight, or about 50% by weight to about 60% by weight of the combination of the aromatic hydrocarbon resin, the inorganic filler, and/or the antioxidant. In one embodiment, the previously described solvent-free composition is loaded into compounding machinery and is extruded/calendared to form the polymer film described elsewhere herein. In one embodiment, after extrusion/calendaring from the compounding machinery, the polymer film is substantially or completely free of solvent.

Methods of Making a Polymer Film from the Solution

In yet another aspect, the present disclosure provides a method of making a polymer film, the method comprising:

(i) loading a solution comprising a butadiene copolymer having a glass transition temperature of about −150° C. to about 150° C. and a butylene polymer having a glass transition temperature of about −90° C. to −40° C. into compounding machinery; and (ii) extruding the solution from the compounding machinery to form a first polymer film.

In one embodiment, the butadiene copolymer and butylene polymer in the first polymer film are oriented such that the first polymer film has a first microstructure. In one embodiment, the first polymer film formed from (i) and (ii) is a single layer polymer film.

In one embodiment, the extruding of (ii) comprises extruding the solution from the compounding machinery onto a metal substrate to form the first polymer film directly on the metal substrate. In another embodiment, the extruding of (ii) comprises extruding the solution from the compounding machinery to form a free-standing first polymer film. In one embodiment, the free-standing first polymer film is placed on top of a metal substrate. In one embodiment, a solvent is applied to one side of the polymer film as a tackifier which aids in adhering the polymer film to the metal substrate. In one embodiment, the solvent comprises an organic solvent. The metal substrate is described elsewhere herein.

In one embodiment, the method further comprises:

(iii) loading a solution comprising a butadiene copolymer having a glass transition temperature of about −150° C. to about 150° C. and a butylene polymer having a glass transition temperature of about −90° ° C. to −40° C. into compounding machinery; and (iv) extruding the solution from the compounding machinery to form a second polymer film.

In one embodiment, the butadiene copolymer and butylene polymer in the second polymer film are oriented such that the second polymer film has a first microstructure.

In one embodiment, extruding of (iv) comprises extruding the solution from the compounding machinery onto the first polymer film to form the second polymer film directly on top of the first polymer film, resulting in a multi-layer polymer film. In one embodiment, the multi-layer polymer film is placed on top of a metal substrate. In another embodiment, extruding of (iv) comprises extruding the solution from the compounding machinery to form a free-standing second polymer film. In one embodiment, the free-standing second polymer film is placed directly on top of the free-standing first polymer film, resulting in a multi-layer polymer film. In one embodiment, the first polymer film and the second polymer film of the multi-layer polymer film interact under elevated temperatures and/or increased pressure such that they adhere or stick to each other. Although not wishing to be limited by theory, the “interaction” or “bonding” between the two polymer films of the multi-layer polymer film can be approximated by a combination of polar and non-polar interactions, generally grouped under the term “surface energy.” Therefore, in one embodiment, the first polymer film and the second polymer film of a multi-layer polymer film are designed to have similar surface energies.

In one embodiment, the multi-layer polymer film is placed on top of a metal substrate. In one embodiment, a solvent is applied to one side of the multi-layer polymer film as a tackifier which aids in adhering the multi-layer polymer film to the metal substrate. In one embodiment, the solvent comprises an organic solvent. The metal substrate is described elsewhere herein. In one embodiment, the first polymer film and/or the second polymer film are substantially free of solvent.

In one embodiment, the butadiene copolymer in the solution of (i) and/or (iii) is described elsewhere herein. In one embodiment, the butylene polymer in the solution of (i) and/or (iii) is described elsewhere herein. In one embodiment, the solvent in the solution of (i) and/or (iii) is described elsewhere herein. In one embodiment, the solution of (i) and/or (iii) further comprises an aromatic hydrocarbon resin, an inorganic filler, an antioxidant, or a combination thereof. In one embodiment, the aromatic hydrocarbon resin, the inorganic filler, and the antioxidant are described elsewhere herein.

In one embodiment, the solution of (i) and/or (iii) comprises about 80% by weight to about 98% by weight solvent, about 1% by weight to about 15% by weight of the butadiene copolymer, and about 0.01% by weight to about 10% by weight of the butylene polymer. In another embodiment, the solution of (i) and/or (iii) further comprises an aromatic hydrocarbon resin, an inorganic filler, an antioxidant, or a combination thereof and the solution of (i) or (iii) comprises about 65% by weight to about 85% by weight solvent, about 5% by weight to about 15% by weight of the butadiene polymer, about 0.01% by weight to about 5% by weight of the butylene polymer, and about 5% by weight to about 25% by weight of the combination of the aromatic hydrocarbon resin, the inorganic filler, and/or the antioxidant.

In yet another aspect, the present disclosure provides a method of making a polymer film, the method comprising:

(i) depositing a solution comprising a butadiene copolymer having a glass transition temperature of about −150° C. to about 150° C. and a butylene polymer having a glass transition temperature of about −90° C. to −40° C. onto a support; and (ii) evaporating the solvent to form a first polymer film.

In one embodiment, the butadiene copolymer and butylene polymer are oriented in the first polymer film such that the first polymer film has a first microstructure. In one embodiment, the first polymer film formed from (i) and (ii) is a single layer polymer film.

In one embodiment, depositing of (i) comprises spraying the solution onto the support or dipping the support into the solution.

In one embodiment, the method further comprises:

(iii) depositing a solution comprising a butadiene copolymer having a glass transition temperature of about −150° C. to about 150° C. and a butylene polymer having a glass transition temperature of about −90° C. to −40° C. directly on top of the first polymer film; and (iv) evaporating the solvent to form a second polymer film on top of the first polymer film.

In one embodiment, the butadiene copolymer and butylene polymer are oriented in the second polymer film such that the second polymer film has a first microstructure. In one embodiment, the deposition of the second polymer film formed on top of the first polymer film results in a multi-layer polymer film.

In one embodiment, depositing of (iii) comprises spraying the solution onto the first polymer film or dipping the support comprising the first polymer film into the solution.

In one embodiment, the support of (i) and/or (iii) comprises a metal substrate. The metal substrate is described elsewhere herein.

In one embodiment, the first polymer film and/or the second polymer film is substantially free of solvent.

In one embodiment, the butadiene copolymer in the solution of (i) and/or (iii) is described elsewhere herein. In one embodiment, the butylene polymer in the solution of (i) and/or (iii) is described elsewhere herein. In one embodiment, the solvent in the solution of (i) and/or (iii) is described elsewhere herein. In one embodiment, the solution of (i) and/or (iii) further comprises an aromatic hydrocarbon resin, an inorganic filler, an antioxidant, or a combination thereof. In one embodiment, the aromatic hydrocarbon resin, the inorganic filler, and the antioxidant are described elsewhere herein.

In one embodiment, the solution of (i) and/or (iii) comprises about 80% by weight to about 98% by weight solvent, about 1% by weight to about 15% by weight of the butadiene copolymer, and about 0.01% by weight to about 10% by weight of the butylene polymer. In another embodiment, the solution of (i) and/or (iii) further comprises an aromatic hydrocarbon resin, an inorganic filler, an antioxidant, or a combination thereof and the solution of (i) or (iii) comprises about 65% by weight to about 85% by weight solvent, about 5% by weight to about 15% by weight of the butadiene polymer, about 0.01% by weight to about 5% by weight of the butylene polymer, and about 5% by weight to about 25% by weight of the combination of the aromatic hydrocarbon resin, the inorganic filler, and/or the antioxidant.

Methods of Making a Polymer Film from the Solvent-Free Composition

In yet another aspect, the present disclosure provides a method of making a polymer film, the method comprising:

(i) loading a solvent-free composition comprising a butadiene copolymer having a glass transition temperature of about −150° C. to about 150° C. and a butylene polymer having a glass transition temperature of about −90° C. to −40° ° C. into compounding machinery; and (ii) extruding the composition from the compounding machinery to form a first polymer film.

In one embodiment, the butadiene copolymer and butylene polymer are oriented in the first polymer film such that the first polymer film has a first microstructure. In one embodiment, the first polymer film formed from (i) and (ii) is a single layer polymer film.

In one embodiment, extruding of (ii) comprises extruding the composition from the compounding machinery onto a metal substrate to form the first polymer film directly on the metal substrate. In another embodiment, extruding of (ii) comprises extruding the composition from the compounding machinery to form a free-standing first polymer film. In one embodiment, the free-standing first polymer film is placed on top of a metal substrate. In one embodiment, a solvent is applied to one side of the polymer film as a tackifier which aids in adhering the polymer film to the metal substrate. In one embodiment, the solvent comprises an organic solvent. The metal substrate is described elsewhere herein.

In one embodiment, the method further comprises:

(iii) loading a solvent-free composition comprising a butadiene copolymer having a glass transition temperature of about −150° C. to about 150° C. and a butylene polymer having a glass transition temperature of about −90° C. to −40° C. into compounding machinery; and (iv) extruding the composition from the compounding machinery to form a second polymer film.

In one embodiment, the butadiene copolymer and butylene polymer are oriented in the second polymer film such that the second polymer film has a first microstructure.

In one embodiment, extruding of (iv) comprises extruding the composition from the compounding machinery onto the first polymer film to form the second polymer film directly on top of the first polymer film, resulting in a multi-layer polymer film. In one embodiment, the multi-layer polymer film is placed on top of a metal substrate. In another embodiment, extruding of (iv) comprises extruding the composition from the compounding machinery to form a free-standing second polymer film. In one embodiment, the free-standing second polymer film is placed directly on top of the free-standing first polymer film, resulting in a multi-layer polymer film. In one embodiment, the first polymer film and the second polymer film of the multi-layer polymer film interact under elevated temperatures and/or increased pressure such that they adhere or stick to each other. Although not wishing to be limited by theory, the "interaction" or "bonding" between the two polymer films of the multi-layer polymer film can be approximated by a combination of polar and non-polar interactions, generally grouped under the term "surface energy." Therefore, in one embodiment, the first polymer film and the second polymer film of a multi-layer polymer film are designed to have similar surface energies.

In one embodiment, the multi-layer polymer film is placed on top of a metal substrate. In one embodiment, a solvent is applied to one side of the multi-layer polymer film as a tackifier which aids in adhering the multi-layer polymer film to the metal substrate. In one embodiment, the solvent comprises an organic solvent. The metal substrate is described elsewhere herein.

In one embodiment, the butadiene copolymer in the composition of (i) and/or (iii) is described elsewhere herein. In one embodiment, the butylene polymer in the composition of (i) and/or (iii) is described elsewhere herein. In one embodiment, the composition of (i) and/or (iii) further comprises an aromatic hydrocarbon resin, an inorganic filler, an antioxidant, or a combination thereof. In one embodiment, the aromatic hydrocarbon resin, the inorganic filler, and the antioxidant are described elsewhere herein. In one embodiment, the composition of (i) and/or (iii) comprises about 30% by weight to about 50% by weight of the butadiene copolymer, about 0.5% by weight to about 15% by weight of the butylene polymer, and about 40% by weight to about 70% by weight of the combination of the aromatic hydrocarbon resin, the inorganic filler, and/or the antioxidant.

Method of Masking a Metal Substrate

In yet another aspect, the present disclosure provides a method of masking a metal substrate, the method comprising: covering a top surface of the metal substrate with a first polymer film comprising two or more chemically resistant polymers such that the first polymer film is in contact with the top surface of the metal substrate; and heating and/or applying mechanical pressure to the first polymer film, resulting in adhesion of the first polymer film to the top surface of the metal substrate.

In one embodiment, the step of covering the top surface of the metal substrate with the first polymer film comprises extruding the first polymer film directly from compounding machinery onto the top surface of the metal substrate. In one embodiment, the solution described above is loaded into the compounding machinery and the first polymer is extruded from the compounding machinery directly onto the top surface of the metal substrate. In one embodiment, the solvent-free composition described above is loaded into the compounding machinery and the first polymer is extruded from the compounding machinery directly onto the top surface of the metal substrate.

In another embodiment, the step of covering the top surface of the metal substrate with the first polymer film comprises placing the first polymer film formed from the solution described above directly onto the top surface of the metal substrate. In one embodiment, the step of covering the top surface of the metal substrate with the first polymer film comprises loading the solution described above into compounding machinery, extruding the first polymer film from the compounding machinery, and placing the first polymer film directly onto the top surface of the metal substrate.

In another embodiment, the step of covering the top surface of the metal substrate with the first polymer film comprises placing the first polymer film formed from the solvent-free composition described above directly onto the top surface of the metal substrate. In one embodiment, the step of covering the top surface of the metal substrate with the first polymer film comprises loading the solvent-free composition described above into compounding machinery, extruding the first polymer film from the compounding machinery, and placing the first polymer film directly onto the top surface of the metal substrate.

In yet another embodiment, the step of covering the top surface of the metal substrate with the first polymer film comprises depositing a solution comprising two or more chemically resistant polymers onto the top surface of the metal substrate and evaporating the solvent, forming the first polymer film. In one embodiment, the solution is described above.

In one embodiment, the first polymer film has a first microstructure and, upon heating and/or applying mechanical pressure to the first polymer film in contact with the metal substrate, the first polymer film adopts a second microstructure. In one embodiment, the second microstructure has increased adhesion to the metal substrate.

In one embodiment, the first polymer film comprises two polymer films with one film extruded from compounding machinery directly on top of the other film. In another embodiment, the first polymer film comprises two polymer films with one film laid directly on top of the other film. In another embodiment, the first polymer film comprises two polymer films wherein one film is formed by depositing a solution comprising two or more chemically resistant polymers directly on top of the other film and then evaporating the solvent to form one polymer film laid directly on top of the other film. In one embodiment, the first polymer film and the second polymer film of the multi-layer polymer film interact under elevated temperatures and/or increased pressure such that they adhere or stick to each other. Although not wishing to be limited by theory, the “interaction” or “bonding” between the two polymer films of the multi-layer polymer film can be approximated by a combination of polar and non-polar interactions, generally grouped under the term “surface energy.” Therefore, in one embodiment, the first polymer film and the second polymer film of a multi-layer polymer film are designed to have similar surface energies.

In one embodiment, the method further comprises: covering a bottom surface of the metal substrate with a second polymer film comprising two or more chemically resistant polymers such that the second polymer film is in contact with the bottom surface of the metal substrate; and heating and/or applying mechanical pressure to the second polymer film, resulting in adhesion of the second polymer film to the bottom surface of the metal substrate.

In one embodiment, the step of covering the bottom surface of the metal substrate with the second polymer film comprises extruding the second polymer film directly from compounding machinery onto the bottom surface of the metal substrate. In one embodiment, the solution described above is loaded into the compounding machinery and the second polymer is extruded from the compounding machinery directly onto the bottom surface of the metal substrate. In one embodiment, the solvent-free composition described above is loaded into the compounding machinery and the second polymer is extruded from the compounding machinery directly onto the bottom surface of the metal substrate.

In another embodiment, the step of covering the bottom surface of the metal substrate with the second polymer film comprises placing the second polymer film formed from the solution described above directly onto the bottom surface of the metal substrate. In one embodiment, the step of covering the bottom surface of the metal substrate with the second polymer film comprises loading the solution described above into compounding machinery, extruding the second polymer film from the compounding machinery, and placing the second polymer film directly onto the bottom surface of the metal substrate.

In another embodiment, the step of covering the bottom surface of the metal substrate with the second polymer film comprises placing the second polymer film formed from the solvent-free composition described above directly onto the bottom surface of the metal substrate. In one embodiment, the step of covering the bottom surface of the metal substrate with the second polymer film comprises loading the solvent-free composition described above into compounding machinery, extruding the second polymer film from the compounding machinery, and placing the second polymer film directly onto the bottom surface of the metal substrate.

In yet another embodiment, the step of covering the bottom surface of the metal substrate with the second polymer film comprises depositing a solution comprising two or more chemically resistant polymers onto the bottom surface of the metal substrate and evaporating the solvent, forming the second polymer film. In one embodiment, the solution is described above.

In one embodiment, the second polymer film has a first microstructure and, upon heating and/or applying mechanical pressure to the second polymer film in contact with the metal substrate, the second polymer film adopts a second microstructure. In one embodiment, the second microstructure has increased adhesion to the metal substrate.

In one embodiment, the method is preceded by the step of cleaning and/or chemically treating a top surface and/or a bottom surface of the metal substrate.

The first and second polymer films are described in the polymer film section elsewhere herein. The metal substrate is described elsewhere herein.

In one embodiment, the method further comprises the one or more of forming, scribing, or chemical processing the masked metal substrate. In one embodiment, following forming scribing, and/or chemical processing, the masked metal substrate undergoes further treatment steps. In one embodiment, the further treatment comprises drilling and/or routing. In one embodiment, the metal substrate is demasked following the forming, scribing, chemical processing, and/or further treatment steps.

In one embodiment, the first polymer film, the second polymer film, or both the first and second polymer films each independently have a first microstructure which is determined by the method used to form the film. In one embodiment, the first microstructure is not optimized to produce adhesion to the metal substrate. Therefore, in one embodiment, a polymer film having a first microstructure will likely fall off of the metal substrate when simply positioned in contact. In one embodiment, the first polymer film, the second polymer film, or both the first and second polymer films each independently comprise low glass transition temperature polymers that have a high mobility at elevated temperatures. Therefore, in one embodiment, the step of heating and/or applying mechanical pressure to the first and/or second polymer films leads the first and/or second polymer film to form a second microstructure. In one embodiment, the (co)polymers which were used to form the first and/or second polymer film reorient under the application of heat and/or pressure, thus leading the polymer film to form a second microstructure. In one embodiment, contact with the metal substrate while heat and/or pressure are applied encourages mechanical and chemical interaction between the first and/or second polymer films and the metal substrate, thus leading the polymer film to form a second microstructure. In one embodiment, the second microstructure has increased adhesion to the metal substrate when compared to the first microstructure. In one embodiment, the increased adhesion of the first and/or second polymer films comprising the second microstructure is such that the polymer film(s) stay adhered to the surface of the metal substrate during forming, scribing, and/or chemical processing. In one embodiment, the first and/or second polymer film(s) having the second microstructure act as maskant. In one embodiment, the maskant can be cut such that one or more pieces of the maskant can be removed while the majority of the maskant remains adhered to the metal substrate. In one embodiment, the maskant is removed after the metal substrate is formed, scribed, and/or chemically processed. In one embodiment, the maskant can be removed by hand.

In one embodiment wherein the first and/or second polymer film comprises two polymer films, the polymer film comprising two polymer films has a different peel adhesion than the peel adhesion of a polymer film that comprises one polymer film. In one embodiment, the peel adhesion of the first and/or second film comprising two polymer films is about 10 oz/in to about 20 oz/in before chemical processing. In one embodiment, the peel adhesion of the first and/or second film comprising two polymer films is about 15 oz/in before chemical processing. In one embodiment, the peel adhesion of the first and/or second film comprising two polymer films is about 15 oz/in to about 25 oz/in after chemical processing. In one embodiment, the peel adhesion of the first and/or second film comprising two polymer films is about 15 oz/in after chemical processing. In one embodiment, the peel adhesion of the first and/or second polymer film comprising two polymer films is measured after the first and/or second polymer film has formed the second microstructure. In embodiment, the peel adhesion is measured on a polished clad aluminum substrate.

In one embodiment, the polymer film acts as a maskant, and when adhered to the metal substrate, has mechanical properties such that if a shape is delineated with tape, the maskant will tear along the tape line without significant error or rough edges. In one embodiment, the tape comprises aluminum tape.

Method of Processing a Metal Substrate

In yet another aspect, the present disclosure provides a method of chemically processing a metal substrate, comprising chemical milling, electroless plating, chemical surface treatment, chemical vapor deposition, or evaporative coating a metal substrate masked with the polymer film described elsewhere herein.

In another aspect, the present disclosure provides a method of chemically processing a metal substrate, comprising chemical milling, electroless plating, chemical surface treatment, chemical vapor deposition, or evaporative coating a metal substrate masked with a polymer film made by the method described elsewhere herein.

In another aspect, the present disclosure provides a method of chemically processing a metal substrate, comprising chemical milling, electroless plating, chemical surface treatment, chemical vapor deposition, or evaporative coating a masked metal substrate made by the method described elsewhere herein.

In yet another aspect, the present disclosure provides a method of electrochemically processing a metal substrate, comprising anodizing, electrochemical polishing, plating, electrostatic coating, or electrofinishing a metal substrate masked with the polymer film described elsewhere herein.

In another aspect, the present disclosure provides a method of electrochemically processing a metal substrate, comprising anodizing, electrochemical polishing, plating, electrostatic coating, or electrofinishing a metal substrate masked with a polymer film made by the method described elsewhere herein.

In another aspect, the present disclosure provides a method of electrochemically processing a metal substrate, comprising anodizing, electrochemical polishing, plating, electrostatic coating, or electrofinishing a masked metal substrate made by the method described elsewhere herein.

Masked Metal Substrate

In yet another aspect, the present disclosure provides a metal substrate comprising an adhered maskant wherein the maskant comprises the polymer film described elsewhere herein.

In another aspect, the present disclosure provides a metal substrate comprising an adhered maskant wherein the maskant comprises a polymer film made by the method described elsewhere herein.

In another aspect, the present disclosure provides a masked metal substrate made by the method described elsewhere herein.

Clauses of the Disclosure

The following clauses describe certain embodiments of the disclosure.

Clause 1. A polymer film comprising a butadiene copolymer having a glass transition temperature of about −150° C. to about 150° C. and a butylene polymer having a glass transition temperature of about −90° C. to −40° C., wherein the butadiene copolymer and butylene polymer are oriented such that the polymer film has a first microstructure.

Clause 2. The polymer film of clause 1, wherein upon contacting the polymer film with a metal substrate under elevated temperature and/or mechanical pressure, the polymer film adopts a second microstructure.

Clause 3. The polymer film of clause 2, wherein the second microstructure has increased adhesion to the metal substrate.

Clause 4. The polymer film of any one of clauses 1-3, wherein the film is chemically resistant to acids and bases.

Clause 5. The polymer film of any one of clauses 1-4, wherein the butadiene copolymer is selected from styrene-butadiene-styrene (SBS), styrene-ethylene-butylene-styrene (SEBS), styrene-ethylene-propylene-styrene (SEPS), and combinations thereof.

Clause 6. The polymer film of any one of clauses 1-5, wherein the butadiene copolymer is styrene-butadiene-styrene (SBS).

Clause 7. The polymer film of clause 6, wherein SBS has a first glass transition temperature of about −115° C. to about −100° C. and a second glass transition temperature of about 95° C. to about 105° C.

Clause 8. The polymer film of any one of clauses 1-5, wherein the butadiene copolymer is a blend of styrene-ethylene-butylene-styrene (SEBS) and styrene-ethylene-propylene-styrene (SEPS).

Clause 9. The polymer film of clause 8, wherein the blend of SEBS and SEPS has a w/w ratio of about 7:1 to about 10:1.

Clause 10. The polymer film of clause 8 or 9, wherein the blend of SEBS and SEPS has a first glass transition temperature of about −50° C. to about −20° C. and a second glass transition temperature of about 90° C. to about 115° C.

Clause 11. The polymer film of any one of clauses 1-10, wherein the butylene polymer is polyisobutylene.

Clause 12. The polymer film of any one of clauses 1-11, wherein the polymer film comprises about 75% to about 95% by weight of the butadiene copolymer and about 5.0% to about 25.0% by weight of the butylene polymer.

Clause 13. The polymer film of any one of clauses 1-12, wherein the polymer film comprises about 87% by weight of the butadiene copolymer and about 13% by weight of the butylene polymer.

Clause 14. The polymer film of any one of clauses 1-13, further comprising an aromatic hydrocarbon resin, an inorganic filler, an antioxidant, or a combination thereof.

Clause 15. The polymer film of clause 14, wherein the aromatic hydrocarbon resin is a C9 resin. Clause 16. The polymer film of clause 15, wherein the C9 resin has a softening point between about 100° C. and about 160° C.

Clause 17. The polymer film of clause 14, wherein the filler is an inorganic mineral oxide or an inorganic carbon.

Clause 18. The polymer film of clause 17, wherein the filler is selected from a silicate, talc, a feldspar, a chlorate, alumina, titania, carbon black, nanostructured carbon, and combinations thereof.

Clause 19. The polymer film of any one of clauses 14-18, wherein the polymer film comprises about 30% by weight to about 50% by weight of the butadiene polymer, about 0.5% by weight to about 15% by weight of the butylene polymer, and about 40% by weight to about 70% by weight of the combination of the aromatic hydrocarbon resin, the inorganic filler, and/or the antioxidant. Clause 20. The polymer film of any one of clauses 1-19, wherein the polymer film is free-standing.

Clause 21. The polymer film of any one of clauses 1-20, wherein the polymer film is substantially solvent-free.

Clause 22. The polymer film of any one of clauses 1-21, wherein the tensile strength of the polymer film is about 650 psi to about 750 psi.

Clause 23. The polymer film of any one of clauses 2-22, wherein the metal substrate is sheet metal.

Clause 24. The polymer film of any one of clauses 3-23, wherein the polymer film having the second microstructure has a peel adhesion to the metal substrate of about 2 oz/in to about 35 oz/in.

Clause 25. The polymer film of clause 24, wherein the metal substrate is an aluminum substrate.

Clause 26. The polymer film of clause 25, wherein the metal substrate is polished clad aluminum.

Clause 27. A method of making a first polymer film, the method comprising:

- (i) loading a solution comprising a butadiene copolymer having a glass transition temperature of about −150° ° C. to about 150° C. and a butylene polymer having a glass transition temperature of about −90° C. to −40° C. into compounding machinery; and
- (ii) extruding the solution from the compounding machinery to form a first polymer film wherein the butadiene copolymer and butylene polymer are oriented such that the first polymer film has a first microstructure.

Clause 28. The method of clause 27, wherein extruding comprises extruding the solution from the compounding machinery onto a metal substrate to form the first polymer film directly on the metal substrate.

Clause 29. The method of clause 27, wherein extruding comprises extruding the solution from the compounding machinery to form a free-standing first polymer film.

Clause 30. The method of clause 29, wherein the free-standing first polymer film is placed on top of a metal substrate.

Clause 31. The method of any one of clauses 27-30, further comprising:

- (iii) loading a solution comprising a butadiene copolymer having a glass transition temperature of about −150° C. to about 150° C. and a butylene polymer having a glass transition temperature of about −90° C. to −40° C. into compounding machinery; and
- (iv) extruding the solution from the compounding machinery to form a second polymer film wherein the butadiene copolymer and butylene polymer are oriented such that the second polymer film has a first microstructure.

Clause 32. The method of clause 31, wherein extruding of (iv) comprises extruding the solution from the compounding machinery onto the first polymer film to form the second polymer film directly on top of the first polymer film, resulting in a multi-layer polymer film.

Clause 33. The method of clause 32, wherein the multi-layer polymer film is placed on top of a metal substrate.

Clause 34. The method of clause 31, wherein extruding of (iv) comprises extruding the solution from the compounding machinery to form a free-standing second polymer film.

Clause 35. The method of clause 34, wherein the free-standing second polymer film is placed directly on top of the free-standing first polymer film, resulting in a multi-layer polymer film.

Clause 36. The method of clause 35, wherein the multi-layer polymer film is placed on top of a metal substrate.

Clause 37. The method of any one of clauses 27-36, wherein the first polymer film and/or the second polymer film are substantially free of solvent.

Clause 38. A method of making a first polymer film, the method comprising:

- (i) depositing a solution comprising a butadiene copolymer having a glass transition temperature of about −150° C. to about 150° C. and a butylene polymer having a glass transition temperature of about −90° C. to −40° C. onto a support; and
- (ii) evaporating the solvent to form a first polymer film wherein the butadiene copolymer and butylene polymer are oriented such that the first polymer film has a first microstructure. Clause 39. The method of clause 38, wherein depositing comprises spraying the solution onto the support or dipping the support into the solution.

Clause 40. The method of clause 38 or 39, further comprising:

- (iii) depositing a solution comprising a butadiene copolymer having a glass transition temperature of about −150° C. to about 150° C. and a butylene polymer having a glass transition temperature of about −90° ° C. to −40° C. directly on top of the first polymer film; and
- (iv) evaporating the solvent to form a second polymer film on top of the first polymer film wherein the butadiene copolymer and butylene polymer are oriented such that the second polymer film has a first microstructure.

Clause 41. The method of clause 40, wherein depositing of (iii) comprises spraying the solution onto the first polymer film or dipping the support comprising the first polymer film into the solution.

Clause 42. The method of any one of clauses 38-41, wherein the support comprises a metal substrate.

Clause 43. The method of any one of clauses 38-42, wherein the first polymer film and/or the second polymer film is substantially free of solvent.

Clause 44. A method of making a first polymer film, the method comprising:

- (i) loading a solvent-free composition comprising a butadiene copolymer having a glass transition temperature of about −150° C. to about 150° C. and a butylene polymer having a glass transition temperature of about −90° C. to −40° C. into compounding machinery; and
- (ii) extruding the composition from the compounding machinery to form a first polymer film wherein the butadiene copolymer and butylene polymer are oriented such that the first polymer film has a first microstructure.

Clause 45. The method of clause 44, wherein extruding comprises extruding the composition from the compounding machinery onto a metal substrate to form the first polymer film directly on the metal substrate.

Clause 46. The method of clause 44, wherein extruding comprises extruding the composition from the compounding machinery to form a free-standing first polymer film.

Clause 47. The method of clause 46, wherein the free-standing first polymer film is placed on top of a metal substrate.

Clause 48. The method of any one of clauses 44-47, further comprising:

- (iii) loading a solvent-free composition comprising a butadiene copolymer having a glass transition temperature of about −150° C. to about 150° C. and a butylene polymer having a glass transition temperature of about −90° C. to −40° C. into compounding machinery; and
- (iv) extruding the composition from the compounding machinery to form a second polymer film wherein the butadiene copolymer and butylene polymer are oriented such that the second polymer film has a first microstructure.

Clause 49. The method of clause 48, wherein extruding of (iv) comprises extruding the composition from the compounding machinery onto the first polymer film to form the second polymer film directly on top of the first polymer film, resulting in a multi-layer polymer film.

Clause 50. The method of clause 49, wherein the multi-layer polymer film is placed on top of a metal substrate.

Clause 51. The method of clause 48, wherein extruding of (iv) comprises extruding the composition from the compounding machinery to form a free-standing second polymer film.

Clause 52. The method of clause 51, wherein the free-standing second polymer film is placed directly on top of the free-standing first polymer film, resulting in a multi-layer polymer film.

Clause 53. The method of clause 52, wherein the multi-layer polymer film is placed on top of a metal substrate.

Clause 54. The method of any one of clauses 27-53, wherein the butadiene copolymer is selected from styrene-butadiene-styrene (SBS), styrene-ethylene-butylene-styrene (SEBS), styrene-ethylene-propylene-styrene (SEPS), and combinations thereof.

Clause 55. The method of any one of clauses 27-54, wherein the butadiene copolymer is styrene-butadiene-styrene (SBS).

Clause 56. The method of clause 55, wherein SBS has a first glass transition temperature of about −115° ° C. to about −100° C. and a second glass transition temperature of about 95° C. to about 105° C.

Clause 57. The method of any one of clauses 27-54, wherein the butadiene copolymer is a blend of styrene-ethylene-butylene-styrene (SEBS) and styrene-ethylene-propylene-styrene (SEPS).

Clause 58. The method of clause 57, wherein the blend of SEBS and SEPS has a w/w ratio of about 7:1 to about 10:1.

Clause 59. The method of clause 57 or 58, wherein the blend of SEBS and SEPS has a first glass transition temperature of about −50° C. to about −20° C. and a second glass transition temperature of about 90° C. to about 115° C.

Clause 60. The method of any one of clauses 27-59, wherein the butylene polymer is polyisobutylene.

Clause 61. The method of any one of clauses 27-43, wherein the solution comprises about 80% by weight to about 98% by weight solvent, about 1% by weight to about 15% by weight of the butadiene copolymer, and about 0.01% by weight to about 10% by weight of the butylene polymer.

Clause 62. The method of any one of clauses 27-43, wherein the solution further comprises an aromatic hydrocarbon resin, an inorganic filler, an antioxidant, or a combination thereof.

Clause 63. The method of clause 62, wherein the solution comprises about 65% by weight to about 85% by weight solvent, about 5% by weight to about 15% by weight of the butadiene polymer, about 0.01% by weight to about 5% by weight of the butylene polymer, and about 5% by weight to about 25% by weight of the combination of the aromatic hydrocarbon resin, the inorganic filler, and/or the antioxidant.

Clause 64. The method of any one of clauses 44-53, wherein the solvent-free composition further comprises an aromatic hydrocarbon resin, an inorganic filler, an antioxidant, or a combination thereof.

Clause 65. The method of clause 64, wherein the solvent-free composition comprises about 30% by weight to about 50% by weight of the butadiene polymer, about 0.5% by weight to about 15% by weight of the butylene polymer, and about 40% by weight to about 70% by weight of the combination of the aromatic hydrocarbon resin, the inorganic filler, and/or the antioxidant.

Clause 66. The method of any one of clauses 62-65, wherein the aromatic hydrocarbon resin is a C9 resin.

Clause 67. The method of clause 66, wherein the C9 resin has a softening point between about 100° ° C. and about 160° C.

Clause 68. The method of any one of clauses 62-67, wherein the filler is an inorganic mineral oxide or an inorganic carbon.

Clause 69. The method of clause 68, wherein the filler is selected from a silicate, talc, a feldspar, a chlorate, alumina, titania, carbon black, nanostructured carbon, and combinations thereof.

Clause 70. A method of masking a metal substrate, the method comprising:

covering a top surface of the metal substrate with a first polymer film comprising two or more chemically resistant polymers such that the first polymer film is in contact with the top surface of the metal substrate; and heating and/or applying mechanical pressure to the first polymer film, resulting in adhesion of the first polymer film to the top surface of the metal substrate.

Clause 71. The method of clause 70, wherein the step of covering the top surface of the metal substrate with the first polymer film comprises extruding the first polymer film directly from compounding machinery onto the top surface of the metal substrate or extruding the first polymer film from compounding machinery and placing the first polymer film onto the top surface of the metal substrate.

Clause 72. The method of clause 71, wherein extruding the first polymer film from the compounding machinery comprises:

loading a solution comprising the two or more chemically resistant polymers into the compounding machinery; and extruding the solution from the compounding machinery to form the first polymer film; or loading a solvent-free composition comprising the two or more chemically resistant polymers into the compounding machinery; and extruding the composition from the compounding machinery to form the first polymer film.

Clause 73. The method of clause 70, wherein the step of covering the top surface of the metal substrate with the first polymer film comprises depositing a solution comprising the two or more chemically resistant polymers onto the top surface of the metal substrate and evaporating the solvent, forming the first polymer film.

Clause 74. The method of any one of clauses 70-73, wherein the first polymer film comprises two polymer films wherein one film is extruded or deposited directly on top of the other film resulting in a multi-layer first polymer film or wherein one film is placed directly on top of the other film resulting in a multi-layer first polymer film.

Clause 75. The method of any one of clauses 70-74, wherein the first polymer film is a free-standing polymer film.

Clause 76. The method of any one of clauses 70-75, wherein the first polymer film has a first microstructure and, upon heating and/or applying mechanical pressure to the first polymer film in contact with the metal substrate, the first polymer film adopts a second microstructure.

Clause 77. The method of clause 76, wherein the second microstructure has increased adhesion to the metal substrate.

Clause 78. The method of any one of clauses 70-77, further comprising:

covering a bottom surface of the metal substrate with a second polymer film comprising two or more chemically resistant polymers such that the second polymer film is in contact with the bottom surface of the metal substrate; and heating and/or applying mechanical pressure to the second polymer film, resulting in adhesion of the second polymer film to the bottom surface of the metal substrate.

Clause 79. The method of clause 78, wherein the step of covering the bottom surface of the metal substrate with the second polymer film comprises extruding the second polymer film directly from compounding machinery onto the bottom surface of the metal substrate or extruding the second polymer film from compounding machinery and placing the second polymer film onto the bottom surface of the metal substrate.

Clause 80. The method of clause 79, wherein extruding the second polymer film from the compounding machinery comprises:

loading a solution comprising the two or more chemically resistant polymers into the compounding machinery; and extruding the solution from the compounding machinery to form the second polymer film; or loading a solvent-free composition comprising the two or more chemically resistant polymers into the compounding machinery; and extruding the composition from the compounding machinery to form the second polymer film.

Clause 81. The method of clause 78, wherein the step of covering the bottom surface of the metal substrate with the second polymer film comprises depositing a solution comprising the two or more chemically resistant polymers onto the bottom surface of the metal substrate and evaporating the solvent, forming the second polymer film.

Clause 82. The method of any one of clauses 78-81, wherein the second polymer film comprises two polymer films wherein one film is extruded or deposited directly on top of the other film resulting in a multi-layer second polymer film or wherein one film is placed directly on top of the other film resulting in a multi-layer second polymer film.

Clause 83. The method of any one of clauses 78-81, wherein the second polymer film is a free-standing polymer film.

Clause 84. The method of any one of clauses 78-83, wherein the second polymer film has a first microstructure and, upon heating and/or applying mechanical pressure to the second polymer film in contact with the metal substrate, the second polymer film adopts a second microstructure.

Clause 85. The method of clause 84, wherein the second microstructure has increased adhesion to the metal substrate.

Clause 86. The method of any one of clauses 70-85, wherein the first polymer film comprises a butadiene copolymer having a glass transition temperature of about −150° C. to about 150° C. and a butylene polymer having a glass transition temperature of about −90° C. to −40° C.

Clause 87. The method of any one of clauses 78-86, wherein the second polymer film comprises a butadiene copolymer having a glass transition temperature of between about −150° C. to about 150° C. and a butylene polymer having a glass transition temperature of about −90° C. to −40° C.

Clause 88. The method of clause 86 or 87, wherein the butadiene copolymer is selected from styrene-butadiene-styrene (SBS), styrene-ethylene-butylene-styrene (SEBS), and styrene-ethylene-propylene-styrene (SEPS).

Clause 89. The method of any one of clauses 86-88, wherein the butadiene copolymer is styrene-butadiene-styrene (SBS).

Clause 90. The method of clause 89, wherein SBS has a first glass transition temperature of between about −115° C. and about −100° C. and a second glass transition temperature of between about 95° C. and about 105° C.

Clause 91. The method of any one of clauses 86-88, wherein the butadiene copolymer is a blend of styrene-ethylene-butylene-styrene (SEBS) and styrene-ethylene-propylene-styrene (SEPS).

Clause 92. The polymer film of clause 93, wherein the blend of SEBS and SEPS has a w/w ratio of about 7:1 to about 10:1.

Clause 93. The polymer film of clause 91 or 92, wherein the blend of SEBS and SEPS has a first glass transition temperature of about −50° C. to about −20° C. and a second glass transition temperature of about 90° C. to about 115° C.

Clause 94. The method of any one of clauses 86-93, wherein the butylene polymer is polyisobutylene.

Clause 95. The method of any one of clauses 86-94, wherein the first polymer film and the second polymer film each independently comprise about 75% to about 95% by weight of the butadiene copolymer and about 5.0% to about 25.0% by weight of the butylene polymer.

Clause 96. The method of any one of clauses 86-95, wherein the first polymer film and the second polymer film each independently comprise about 87% by weight of the butadiene copolymer and about 13% by weight of the butylene polymer.

Clause 97. The method of any one of clauses 78-96, wherein the first polymer film and the second polymer film each independently further comprise an aromatic hydrocarbon resin, an inorganic filler, an antioxidant, or a combination thereof.

Clause 98. The method of clause 97, wherein the aromatic hydrocarbon resin is a C9 resin.

Clause 99. The method of clause 98, wherein the C9 resin has a softening point between about 100° C. and about 160° C.

Clause 100. The method of clause 99, wherein the filler is an inorganic mineral oxide or an inorganic carbon.

Clause 101. The method of clause 100, wherein the filler is selected from a silicate, talc, a feldspar, a chlorate, alumina, titania, carbon black, nanostructured carbon, and combinations thereof.

Clause 102. The method of any one of clauses 97-101, wherein the first polymer film and the second polymer film each independently comprise about 30% by weight to about 50% by weight of the butadiene polymer, about 0.5% by weight to about 15% by weight of the butylene polymer, and about 40% by weight to about 70% by weight of the combination of the aromatic hydrocarbon resin, the inorganic filler, and/or the antioxidant.

Clause 103. The method of any one of clauses 78-102, wherein the first polymer film and the second polymer film each independently have a tensile strength of about 650 psi to about 750 psi.

Clause 104. The method of any one of clauses 78-103, wherein the metal substrate is sheet metal.

Clause 105. The method of clause 104, wherein the first polymer film and the second polymer film each independently have a peel adhesion to the metal substrate of about 2 oz/in to about 35 oz/in.

Clause 106. The method of clause 104, wherein the metal substrate is an aluminum substrate.

Clause 107. The method of clause 106, wherein the metal substrate is polished clad aluminum.

Clause 108. The method of any one of clauses 70-107, wherein the method is preceded by the step of cleaning and/or chemically treating a top surface and a bottom surface of the metal substrate.

Clause 109. A method of chemically processing a metal substrate, comprising chemical milling, electroless plating, chemical surface treatment, chemical vapor deposition, or evaporative coating a metal substrate masked with the polymer film of any one of clauses 1-26.

Clause 110. A method of electrochemically processing a metal substrate, comprising anodizing, electrochemical polishing, plating, electrostatic coating, or electrofinishing a metal substrate masked with the polymer film of any one of clauses 1-26.

Clause 111. A method of chemically processing a metal substrate, comprising chemical milling, electroless plating, chemical surface treatment, chemical vapor deposition, or evaporative coating a metal substrate masked with a polymer film made by the method of any one of clauses 27-69.

Clause 112. A method of electrochemically processing a metal substrate, comprising anodizing, electrochemical polishing, plating, electrostatic coating, or electrofinishing a metal substrate masked with a polymer film made by the method of any one of clauses 27-69.

Clause 113. A method of chemically processing a metal substrate, comprising chemical milling, electroless plating, chemical surface treatment, chemical vapor deposition, or evaporative coating a masked metal substrate made by the method of any one of clauses 70-108.

Clause 114. A method of electrochemically processing a metal substrate, comprising anodizing, electrochemical polishing, plating, electrostatic coating, or electrofinishing a masked metal substrate made by the method of any one of clauses 70-108.

Clause 115. A metal substrate comprising an adhered maskant, wherein the maskant comprises the polymer film of any one of clauses 1-26.

Clause 116. A metal substrate comprising an adhered maskant, wherein the maskant comprises the polymer film made by the method of any one of clauses 27-69.

Clause 117. A masked metal substrate made by the method of any one of clauses 70-108.

EXAMPLES

Example 1

The present disclosure relates to the use of polymeric materials with specific properties. Maskants for chemical processing must be chemically and mechanically robust, with the ability to withstand corrosive chemicals at elevated temperatures, all while protecting the substrate and remaining peelable after processing. The polymers typically used for this application are mostly non-polar and very insoluble in aqueous media. They are also mechanically tough to allow facile removal from a workpiece after chemical processing.

Typical application of a maskant to a workpiece is achieved by solution processing where the highly mobile maskant components can self-assemble onto the workpiece surface as the solubility limit is reached during evaporation (solvent-based and water-based maskants) or as the polymerization and cross-linking reaction creates an elastomeric matrix (2-component). Although not wishing to be limited by theory, structure property reasoning suggests that, if given sufficient thermal energy for rotation and translation (or mobility due to the solvation of an organic solvent) polymer chains will orient themselves to an optimized geometry/morphology with respect to a substrate's surface. This process is dependent on the chemical makeup of the polymers with glass transition temperature and melt-flow being key parameters. Supposing that the maskant has time to self-assemble during the cure/evaporation process, this is the conformation that one would expect. The creation of this adhesion is important to achieving nominal performance for maskants in chemical milling and chemical processing.

In attempting to produce maskant films on a workpiece without the use of solvated polymers or in situ polymerization reaction, the problem of material-surface self-assembly is encountered. A free-standing polymer film possesses an established microscopic structure that has been determined by the method of film formation. This microstructure is not necessarily optimized to produce adhesion to a workpiece and a randomly oriented maskant film will likely fall off of a workpiece when simply positioned in contact. The present disclosure overcomes the limitation of a preferred orientation for maskant-surface interactions by utilizing polymeric materials that can re-orient themselves to best interact with a workpiece surface. Specifically, low glass-transition temperature polymers are understood to have a high mobility at elevated temperatures. The application of elevated temperature in combination with increased pressure to encourage mechanical and chemical interaction between a maskant and a workpiece surface allows the maskant polymers to adopt the preferred orientation that will result in the maximum film adhesion, thus allowing chemical processing. This technology has the potential to significantly reduce waste, allow extremely precise coating thicknesses, and minimize the presence of air-entrapment defects.

Briefly, the present disclosure provides a masked workpiece structure formed without the use of any liquid solvents in the masking process and a method for masking a workpiece by application of a freestanding film of cured maskant. Generally, this method involves pressing the freestanding film onto the workpiece at elevated temperature and pressure for a period of time. This process results in adhesion of the maskant to the workpiece sufficient to perform the subsequent forming, scribing, and chemical processing steps required in the manufacture of aerospace parts. The structure produced includes an infinitely variable arrangement and stacking of freestanding maskant films "above" and "below" the workpiece, including maskant films of wide-ranging composition.

The present disclosure provides a method for the masking of a workpiece using the physical instruments of temperature and pressure as opposed to the chemical methods of reaction, cure, or evaporation. The present disclosure further provides a method for masking a workpiece that can be used in an industrial scale production line. The present disclosure further permits the user to mask both sides of a workpiece with at least one maskant composition. Therefore, the present disclosure allows the user to mask either side of a workpiece with multiple films of varying composition as well as with dissimilar films on either side of the workpiece.

FIG. 1 is a cross-sectional, elevational view of a freestanding film placed atop a worksheet by the method of this disclosure. (Apparatus for application of temperature and pressure is omitted for clarity)

FIG. 2 is a perspective view of a freestanding film placed atop a worksheet by the method of this disclosure. (Apparatus for application of temperature and pressure is omitted for clarity)

Figures 3, 4:
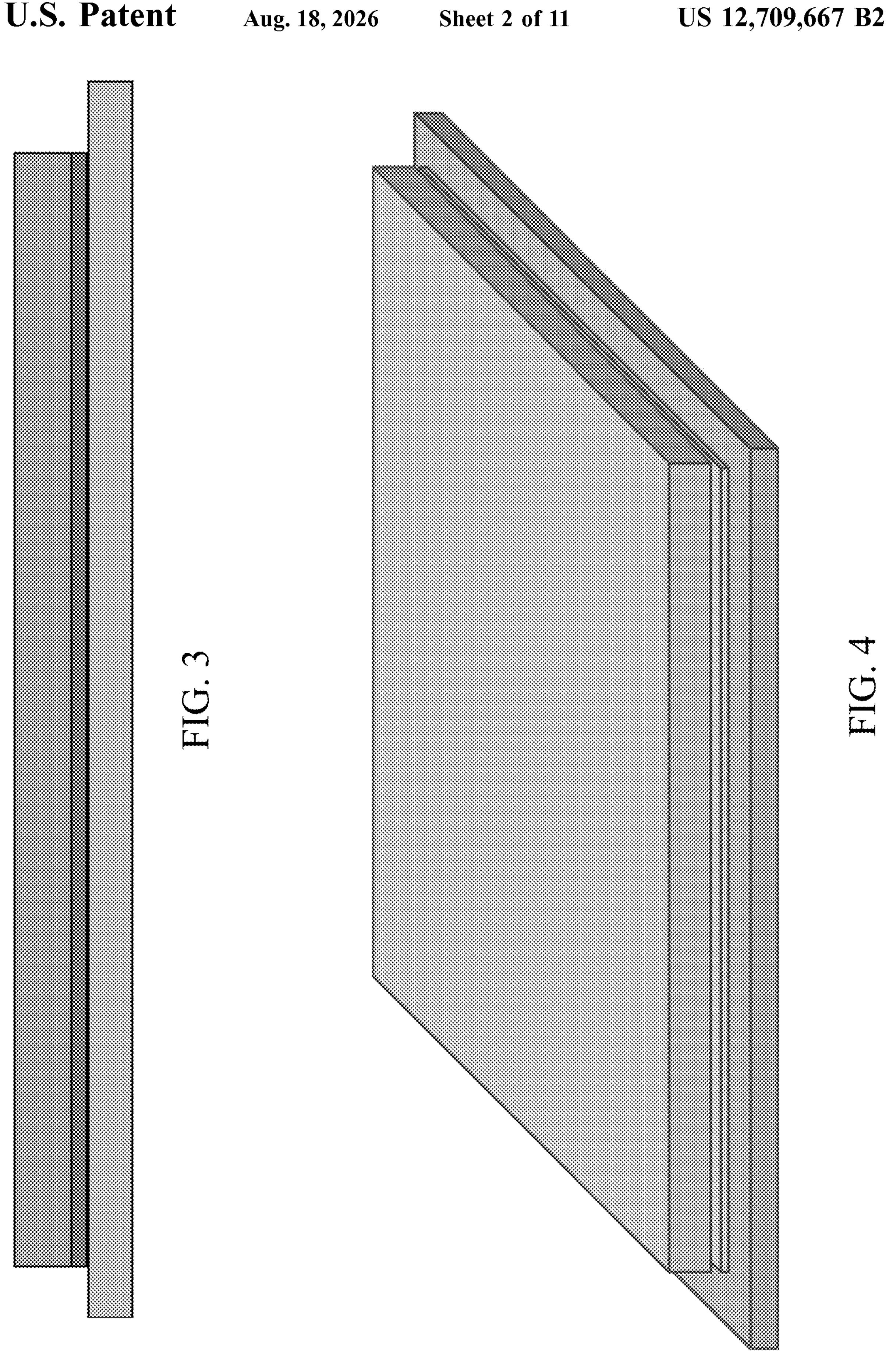
FIG. 3 is a cross-sectional, elevational view of a multilayer freestanding film placed atop a worksheet by the method of this disclosure. (Apparatus for application of temperature and pressure is omitted for clarity)
FIG. 4 is a perspective view of a multilayer freestanding film placed atop a worksheet by the method of this disclosure. (Apparatus for application of temperature and pressure is omitted for clarity)

FIG. 3 is a cross-sectional, elevational view of a multilayer freestanding film placed atop a worksheet by the method of this disclosure. (Apparatus for application of temperature and pressure is omitted for clarity)

FIG. 4 is a perspective view of a multilayer freestanding film placed atop a worksheet by the method of this disclosure. (Apparatus for application of temperature and pressure is omitted for clarity)

Figure 5:
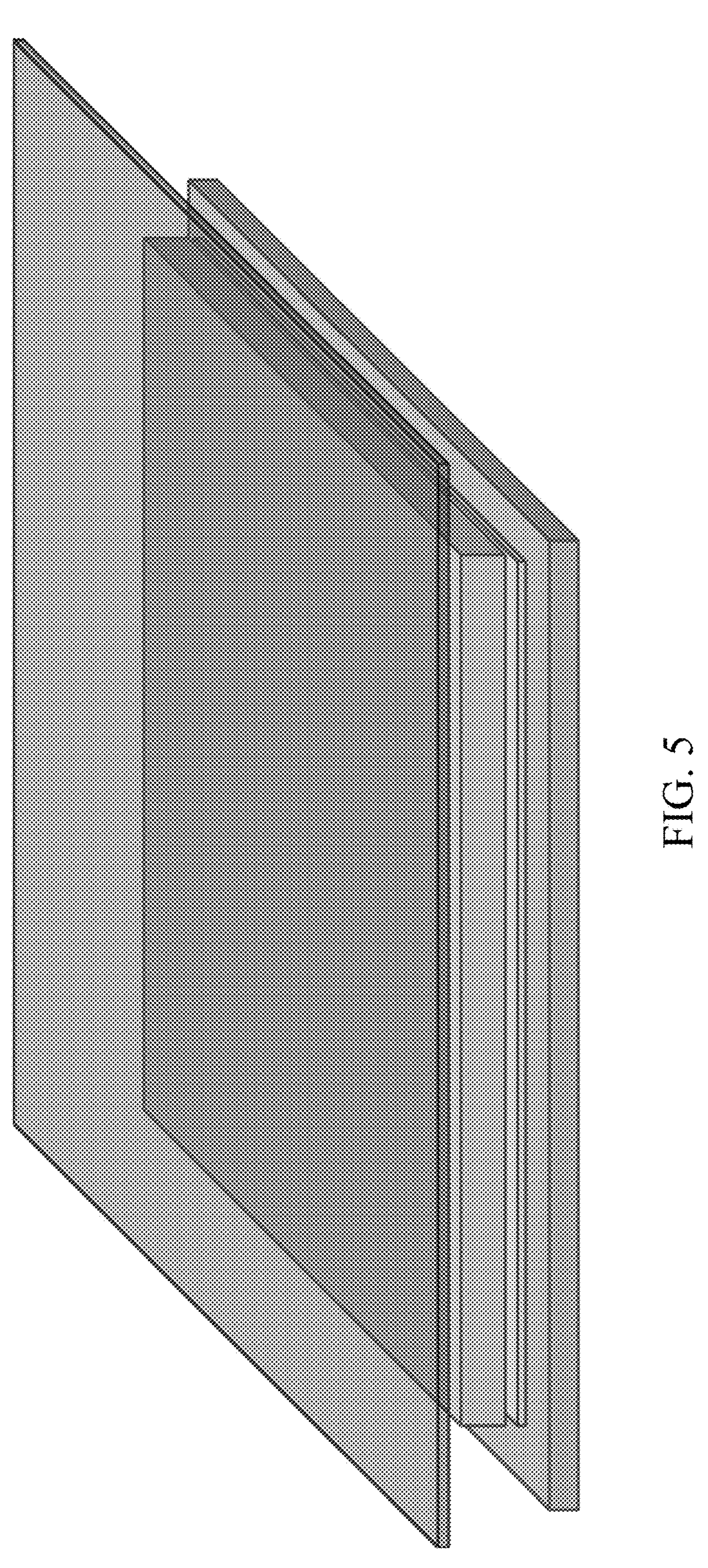
FIG. 5 is a perspective view of a multilayer freestanding film placed atop a worksheet by the method of this disclosure. Further atop the multilayer freestanding film is a release element which prevents sticking to the temperature and pressure application apparatus.

FIG. 5 is a perspective view of a multilayer freestanding film placed atop a worksheet by the method of this disclosure. Further atop the multilayer freestanding film is a release element which prevents sticking to the temperature and pressure application apparatus.

FIG. 6 is a table detailing the composition of the solution used to produce a re-adherence layer freestanding film which is then used to form multilayer sandwich structures atop a workpiece.

FIG. 7 is a table reporting the resulting adhesion of single layer and two-layer maskant applied to a workpiece using the method of this disclosure and the change associated with chemical processing.

Figure 8:
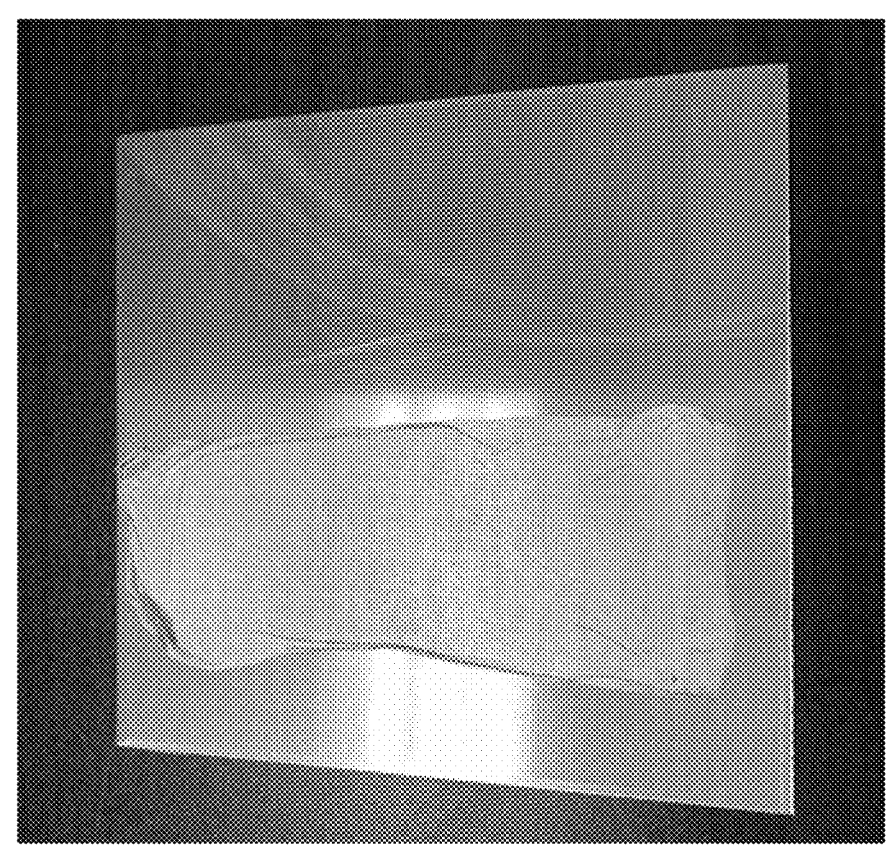
FIG. 8 contains two photographs showing the hand removal of re-adherence layer freestanding film and placement atop a workpiece.
Figure 8:

FIG. 8 contains two photographs showing the hand removal of re-adherence layer freestanding film and placement atop a workpiece.

FIG. 9 contains two photographs showing the placement of a freestanding maskant film atop the re-adherence layer forming a sandwich (multilayer films) atop a worksheet prior to (left) and after (right) application of elevated temperature and pressure. The photograph on the right also shows knife-scribe lines for testing of chemical milling line definition and adhesion.

Figure 10:
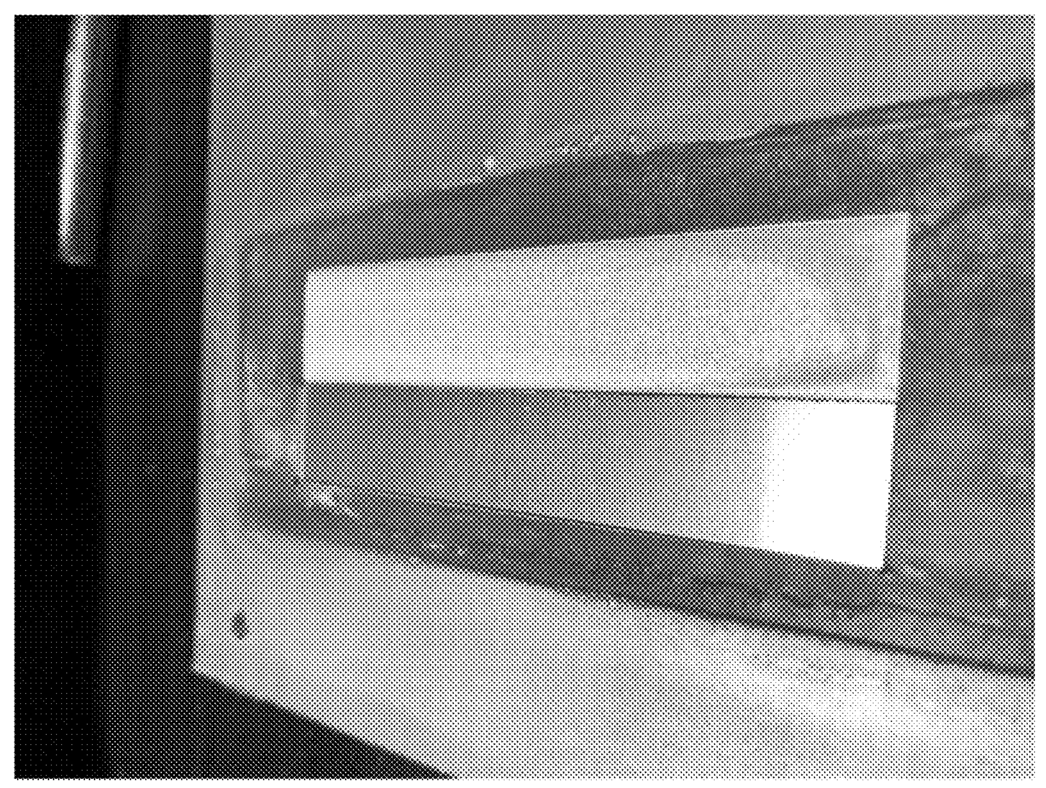
FIG. 10 contains two photographs showing multilayer maskant film post chemical processing. Maskant peeled cleanly from the workpiece with increased adhesion compared to before chemical processing. Line definition of etched pocket is nominal.
Figure 10:
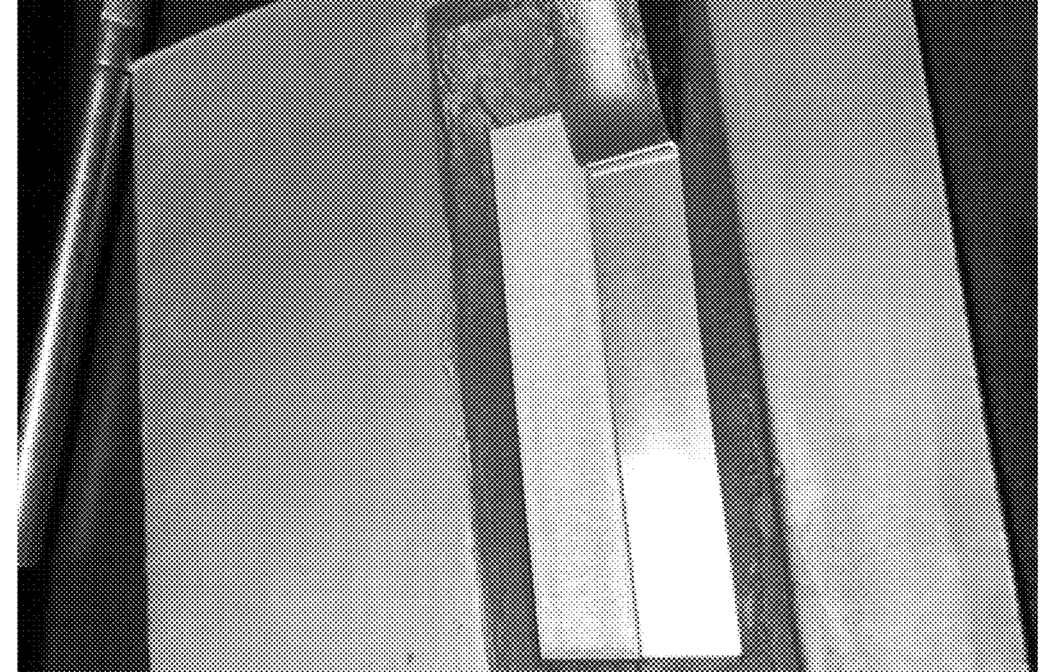

FIG. 10 contains two photographs showing multilayer maskant film post chemical processing. Maskant peeled cleanly from the workpiece with increased adhesion compared to before chemical processing. Line definition of etched pocket is nominal.

Figure 11:
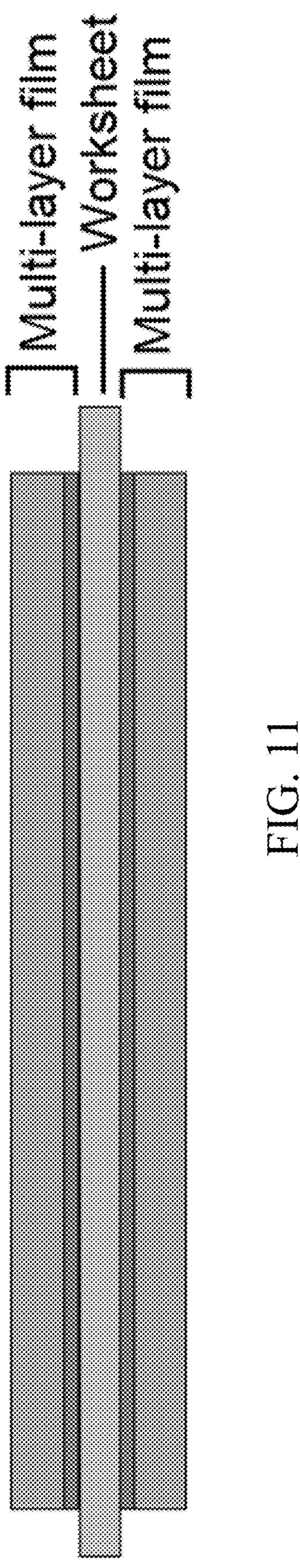
FIG. 11 is a cross-sectional, elevational view of a multilayer freestanding film placed on both sides of a worksheet by the method of this disclosure. (Apparatus for application of temperature and pressure is omitted for clarity)

FIG. 11 is a cross-sectional, elevational view of a multilayer freestanding film placed on both sides of a worksheet by the method of this disclosure. (Apparatus for application of temperature and pressure is omitted for clarity)

Figure 12:
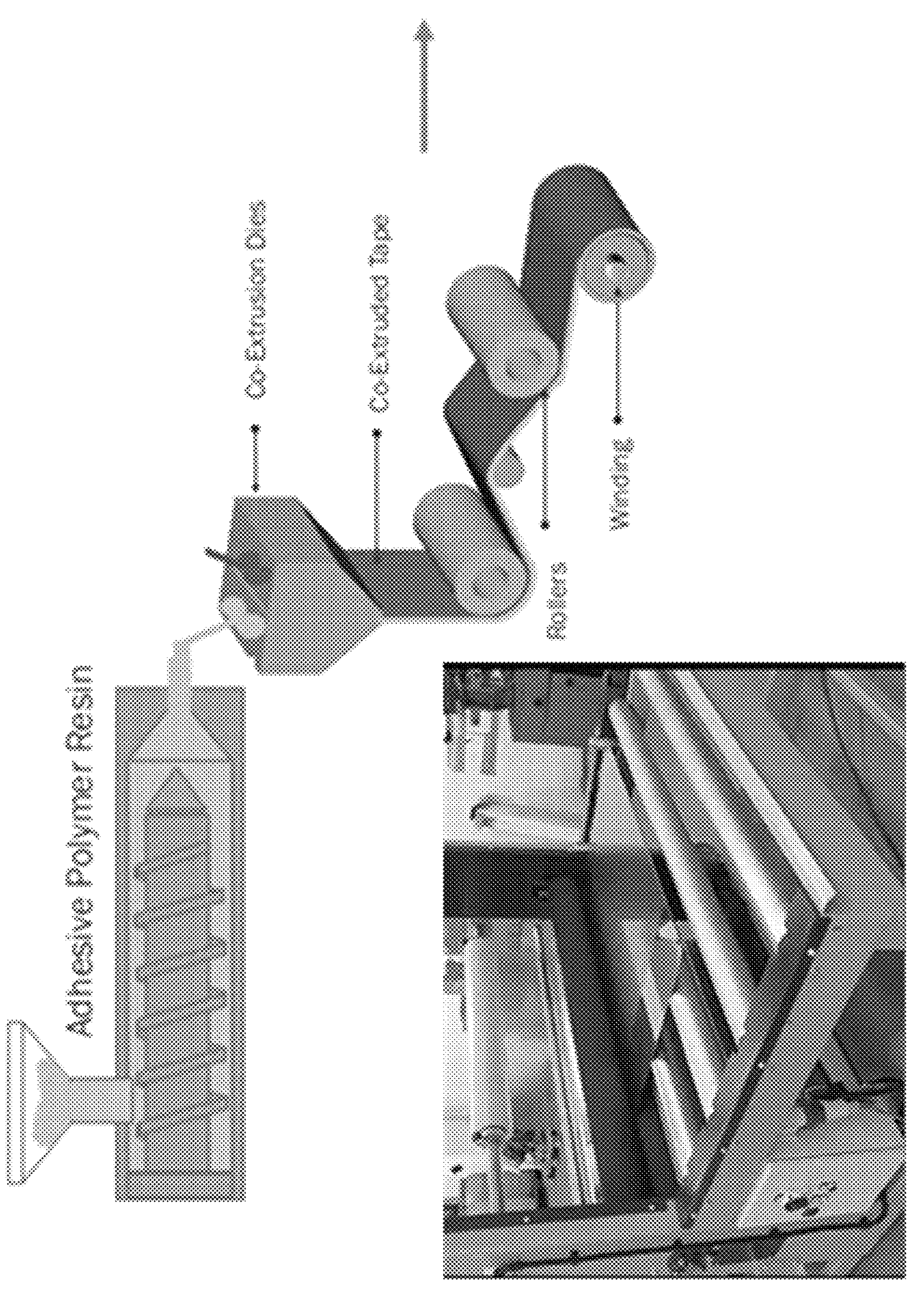
FIG. 12 is a schematic diagram of scaled-up industrial process for application of multilayer freestanding maskant films to workpiece using the method of this disclosure. (Apparatus for mixing/compounding of maskant film raw materials is omitted for clarity)

FIG. 12 is a schematic diagram of scaled-up industrial process for application of multilayer freestanding maskant films to workpiece using the method of this disclosure.

(Apparatus for Mixing/Compounding of Maskant Film Raw Materials is Omitted for Clarity)

Table 1 provides an overview of the physical property requirements of a cured maskant of the disclosure.

TABLE 1

| Property | Description |
|---|---|
| High tensile strength | Approx. 700 psi |
| Easily scribed, exacto knife or laser | |
| Low stable peel adhesion, both initial and aged film | 10-20 oz/inch on polished clad Al |
| Medium elongation | 300% |
| Resistant to all etchants | BAC 5772 type 2, type 1, titanium, steel |
| Easily demasked after all processes | 10-20 oz/inch on polished clad Al |
| Line visibility after scribing | |
| Maintain proper etch factors | |
| Touch up | Repairs & line sealing compatible |
| Solvent resistant | Resistant to solvent based line sealers, repaircoats |
| UV resistance | Outside storage |
| Water resistant | |
| Rtv silicone compatible | |
| Tearable, can cut film without knife | BAC 5986 |
| Anodizing resistant | BAC 5555, Cannot leach into solution, no seepage |
| Metal bonding | 250 F./350 F. in autoclave 3 hours |
| Aging | 375 F. for 10 hours |
| Routable | Does not bind cutting tools |
| Drill & countersink | For rivet install |

Example 2. Single Layer Polymer Film

Table 2 provides the adhesion of a single layer polymer film to a metal substrate as the polymer film comprises increasing amounts of an additive selected from an aromatic hydrocarbon resin, an inorganic filler, an antioxidant, or a combination thereof.

TABLE 2

| Sample | Description | Adhesion (oz/in) |
|---|---|---|
| TM-68A | 8.48% by weight additive | 14.67 |
| TM-68B | 9.66% by weight additive | 13.33 |
| TM-68C | 10.82% by weight additive | 8 |
| TM-68D | 11.98% by weight additive | 10.67 |

Table 3 provides the ingredients for a solvent-free composition that can be used to make a polymer film.

TABLE 3

| Solid Film Composition | Wt. % |
|---|---|
| SEBS | 36.15 |
| SEPS | 4.66 |
| Mineral oxide 1 | 49.88 |
| Resin 1 | 1.83 |
| Resin 2 | 1.44 |
| Polyisobutylene | 4.16 |
| Mineral oxide 2 | 1.44 |
| Antioxidant 1 | 0.22 |
| Antioxidant 2 | 0.22 |
| | 100 |

Table 4 provides the ingredients for a solution that was used to make a polymer film (sample TM-68D).

TABLE 4

| Solvent-deposited film composition TM-68D | Wt. % |
|---|---|
| Organic solvent 1 | 75.98 |
| Polyisobutylene | 1 |
| Resin 1 | 0.44 |
| Mineral oxide 1 | 0.346 |
| Resin 2 | 0.64 |
| Antioxidant 1 | 0.052 |
| Antioxidant 2 | 0.052 |
| Mineral oxide 2 | 11.98 |
| Organic solvent 2 | 0.1 |
| SEPS | 0.97 |
| SEBS | 8.44 |
| | 100 |

Table 5 provides chemical milling adhesion data of sample TM-68D.

TABLE 5

| Chem mill of TM-68D (Adhesion in oz./in) | | | | |
|---|---|---|---|---|
| Sample | Initial | 1st mill | 2nd mill | Next day |
| TM-68D | 10 | 12 | 12 | 12 |

Figure 13A:
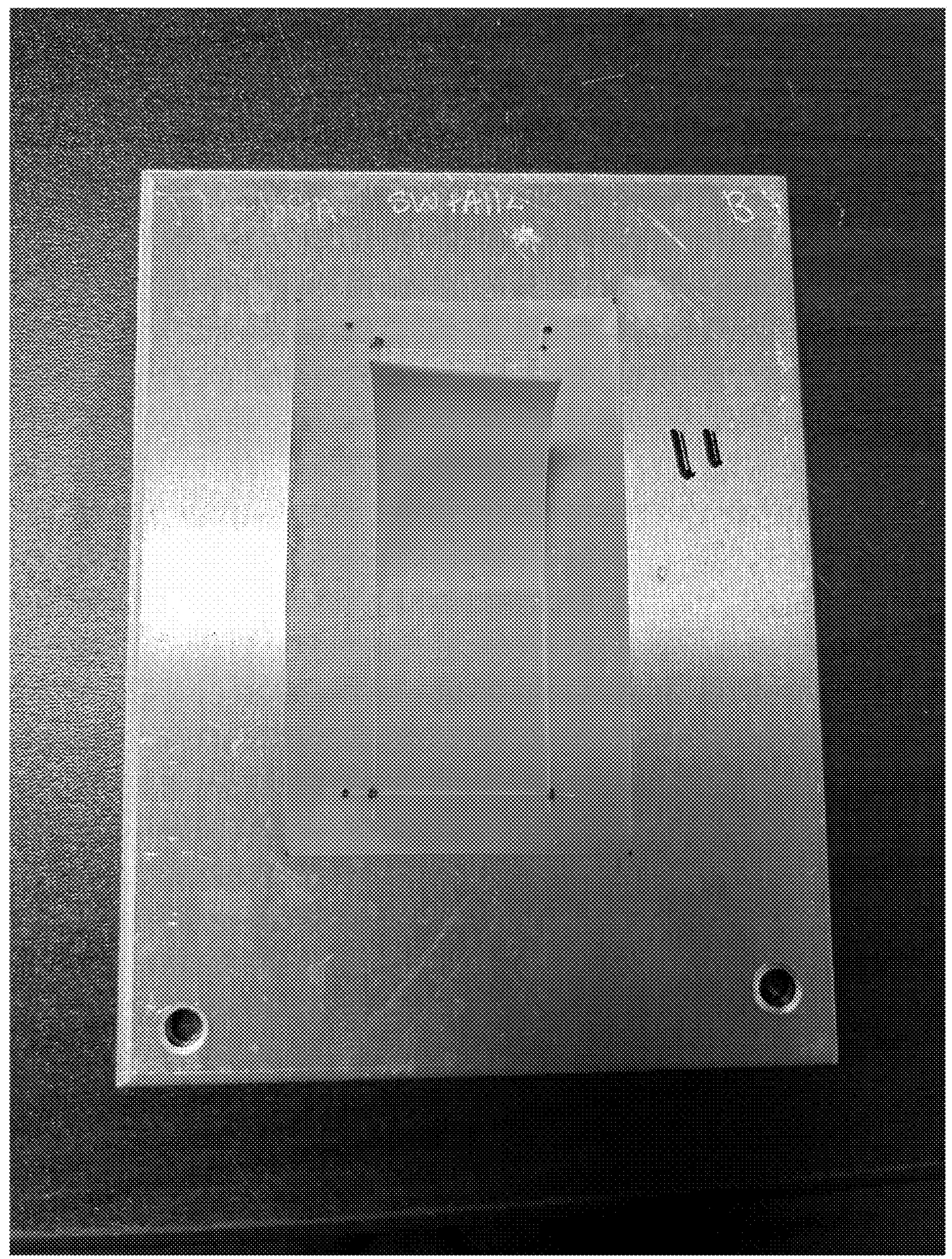
FIGS. 13A-13B are photographs of single layer polymer film maskants on a metal substrate.
Figure 13B:
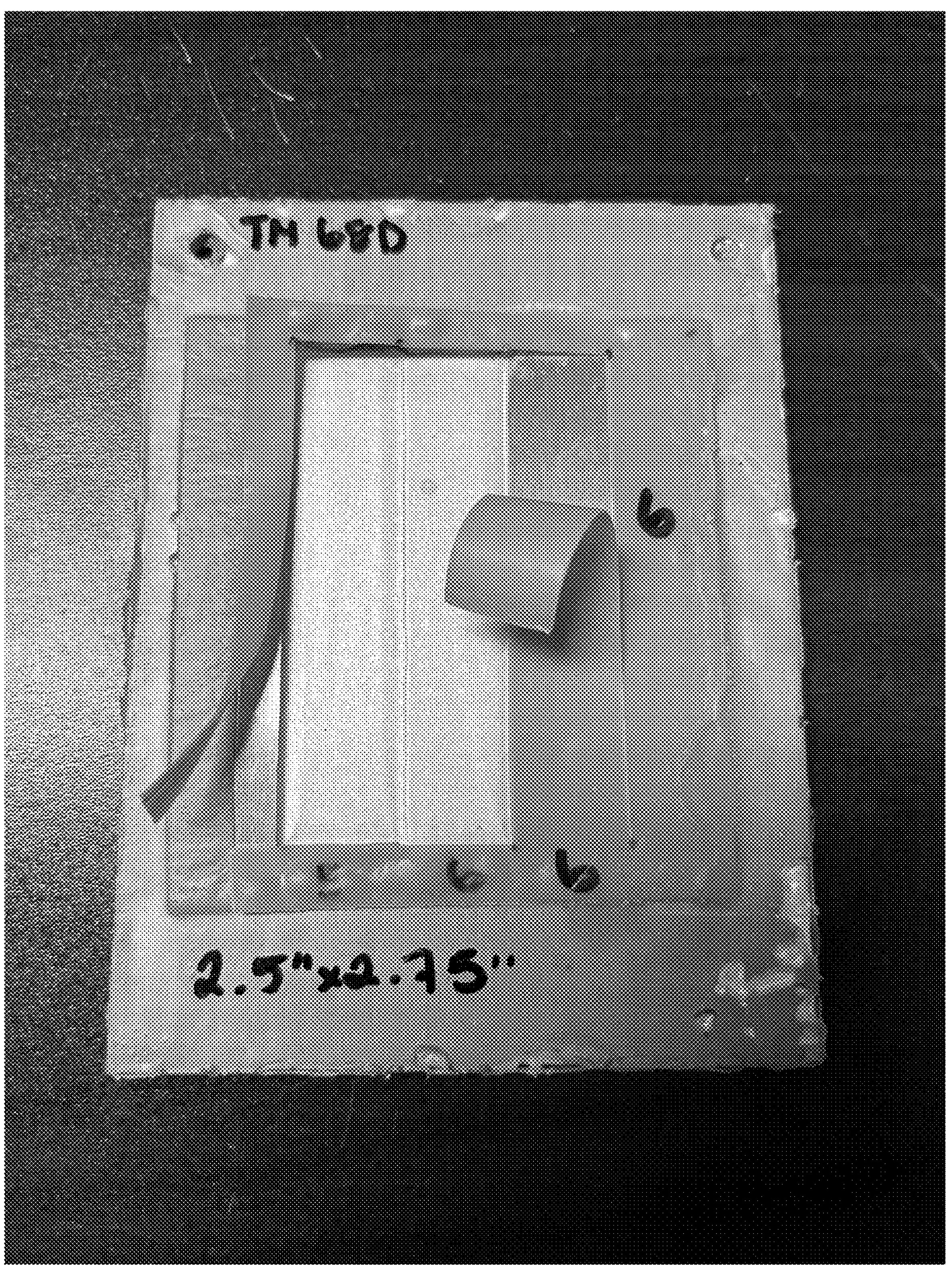

FIGS. 13A-13B are photographs of single layer polymer film maskants on a metal substrate.

Table 6 describes the mechanical properties of several maskants of the disclosure that have been cast from solvent onto aluminum substrates and then tested as freestanding films. The TM samples are softer than AC-850 HS Tan (a multi-use maskant with desired properties), but the properties can be further modified as necessary with additives.

TABLE 6

| Specimen ID | Tensile (psi) |
|---|---|
| AC-850-HS Tan | >700 |
| TM68A | 463.8 |
| TM68D | 541.0 |
| TM68D-1 | 612.5 |

It is noted that terms like "preferably," "commonly," and "typically" are not used herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

The various methods and techniques described above provide a number of ways to carry out the invention. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included, and others specifically excluded in diverse embodiments.

Although the application has been disclosed in the context of certain embodiments and examples, it will be understood by those skilled in the art that the embodiments of the invention extend beyond the specifically disclosed embodiments to other alternative embodiments and/or uses and modifications and equivalents thereof.

In some embodiments, the numbers expressing quantities of ingredients, properties such as molecular weight, reaction conditions, and so forth, used to describe and claim certain embodiments of the application are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

In some embodiments, the terms "a" and "an" and "the" and similar references used in the context of describing a particular embodiment of the application (especially in the context of certain of the following claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed. As used in the disclosure or claims, "another" means at least a second or more, unless otherwise specified. As used in the disclosure, the phrases "such as," "for example," and "e.g." mean "for example, but not limited to" in that the list following the term ("such as," "for example," or "e.g.") provides some examples but the list is not necessarily a fully inclusive list. The word "comprising" means that the items following the word "comprising" may include additional unrecited elements or steps; that is, "comprising" does not exclude additional unrecited steps or elements. No language in the specification should be construed as indicating any non-claimed element essential to the practice of the application.

Unless otherwise indicated, all numbers expressing quantities of ingredients, properties such as reaction conditions, and so forth used in the specification and claims are to be understood as being modified in all instances by the term "about". Accordingly, unless indicated to the contrary, the numerical parameters set forth in this specification and claims are approximations that can vary depending upon the desired properties sought to be obtained by the presently disclosed subject matter. As used herein, the term "about," when referring to a value or to an amount of mass, weight, time, volume, concentration or percentage is meant to encompass variations of in some embodiments±20%, in some embodiments±10%, in some embodiments ±5%, in some embodiments±1%, in some embodiments±0.5%, and in some embodiments ±0.1% from the specified amount, as such variations are appropriate to perform the disclosed method.

Preferred embodiments of this application are described herein. Variations on those preferred embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the invention. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

The invention claimed is:

1. A polymer film comprising a copolymer comprising a blend of styrene-ethylene-butylene-styrene (SEBS) and styrene-ethylene-propylene-styrene (SEPS) having a glass transition temperature of about −150° C. to about 150° C. and a butylene polymer having a glass transition temperature of about −90° C. to −40° C., wherein the copolymer and butylene polymer are oriented such that the polymer film has a first microstructure and, upon contacting the polymer film with a metal substrate under elevated temperature and/or mechanical pressure, the polymer film has a second microstructure with increased adhesion to the metal substrate, wherein the polymer film comprises about 75% to about 95% by weight of the copolymer and about 5.0% to about 25.0% by weight of the butylene polymer.

2. The polymer film of claim 1, wherein the film is chemically resistant to acids and bases.

3. The polymer film of claim 1, wherein the blend of SEBS and SEPS has a w/w ratio of about 7:1 to about 10:1.

4. The polymer film of claim 1, wherein the blend of SEBS and SEPS has a first glass transition temperature of about −50° C. to about −20° C. and a second glass transition temperature of about 90° C. to about 115° C.

5. The polymer film of claim 1, wherein the butylene polymer is polyisobutylene.

6. The polymer film of claim 1, further comprising an aromatic hydrocarbon resin, an inorganic filler, an antioxidant, or a combination thereof.

7. The polymer film of claim 6, wherein the aromatic hydrocarbon resin is a C9 resin, the filler is an inorganic mineral oxide or an inorganic carbon, and/or the antioxidant is a hindered phenolic compound or dilauryl thiodipropionate.

8. The polymer film of claim 7, wherein the filler is selected from a silicate, talc, a feldspar, a chlorate, alumina, titania, carbon black, nanostructured carbon, and combinations thereof.

9. A method of making a polymer film, the method comprising:

(i) loading a solution comprising a copolymer comprising a blend of styrene-ethylene-butylene-styrene (SEBS) and styrene-ethylene-propylene-styrene (SEPS) having a glass transition temperature of about −150° C. to about 150° C. and a butylene polymer having a glass transition temperature of about −90° C. to −40° C. into compounding machinery; and (ii) extruding the solution from the compounding machinery to form a first polymer film of claim 1.

10. A method of making a polymer film, the method comprising:

(i) depositing a solution comprising a copolymer comprising a blend of styrene-ethylene-butylene-styrene (SEBS) and styrene-ethylene-propylene-styrene (SEPS) having a glass transition temperature of about −150° C. to about 150° C. and a butylene polymer having a glass transition temperature of about −90° C. to −40° C. onto a support; and (ii) evaporating the solvent to form a first polymer film of claim 1.

11. A method of making a polymer film, the method comprising:

(i) loading a solvent-free composition comprising a copolymer comprising a blend of styrene-ethylene-butylene-styrene (SEBS) and styrene-ethylene-propylene-styrene (SEPS) having a glass transition temperature of about −150° C. to about 150° C. and a butylene polymer having a glass transition temperature of about −90° C. to −40° C. into compounding machinery; and (ii) extruding the composition from the compounding machinery to form a first polymer film of claim 1.

12. A method of masking a metal substrate, the method comprising:

covering a top surface of the metal substrate with a first polymer film of claim 1 such that the first polymer film is in contact with the top surface of the metal substrate; and heating and/or applying mechanical pressure to the first polymer film, resulting in adhesion of the first polymer film to the top surface of the metal substrate.

13. A masked metal substrate made by the method of claim 12.

14. A method of chemically processing a metal substrate, comprising:

chemical milling, electroless plating, chemical surface treatment, chemical vapor deposition, or evaporative coating a metal substrate masked with the polymer film of claim 1.

15. A method of electrochemically processing a metal substrate, comprising:

anodizing, electrochemical polishing, plating, electrostatic coating, or electrofinishing a metal substrate masked with the polymer film of claim 1.

16. A metal substrate comprising an adhered maskant, wherein:

the maskant comprises the polymer film of claim 1.

17. The polymer film of claim 1, wherein the polymer film is free-standing.

18. The polymer film of claim 1, wherein the tensile strength of the polymer film is about 650 psi to about 750 psi.

19. The polymer film of claim 1, wherein the polymer film having the second microstructure has a peel adhesion to the metal substrate of about 2 oz/in to about 35 oz/in.

* * * * *